(12) United States Patent
Hu

(10) Patent No.: US 10,103,317 B2
(45) Date of Patent: Oct. 16, 2018

(54) SYSTEMS AND METHODS FOR IMPLEMENTING EFFICIENT MAGNETOELECTRIC JUNCTIONS

(71) Applicant: Inston, Inc., Santa Monica, CA (US)

(72) Inventor: Qi Hu, Cypress, CA (US)

(73) Assignee: Inston, Inc., Santa Monica, CA (US)

( * ) Notice: Subject to any disclaimer, the term of this patent is extended or adjusted under 35 U.S.C. 154(b) by 0 days.

(21) Appl. No.: 14/681,358

(22) Filed: Apr. 8, 2015

(65) Prior Publication Data

US 2016/0197263 A1 Jul. 7, 2016

Related U.S. Application Data

(60) Provisional application No. 62/099,948, filed on Jan. 5, 2015.

(51) Int. Cl.
| | |
|---|---|
| *H01L 43/02* | (2006.01) |
| *G11C 11/16* | (2006.01) |
| *G11C 11/18* | (2006.01) |
| *H01L 43/08* | (2006.01) |

(52) U.S. Cl.
CPC ............ *H01L 43/02* (2013.01); *G11C 11/161* (2013.01); *G11C 11/1675* (2013.01); *G11C 11/18* (2013.01); *H01L 43/08* (2013.01)

(58) Field of Classification Search
None
See application file for complete search history.

(56) References Cited

U.S. PATENT DOCUMENTS

| | | | |
|---|---|---|---|
| 4,038,596 A | 7/1977 | Lee | |
| 6,040,996 A | 3/2000 | Kong | |
| 6,114,719 A | 9/2000 | Dill et al. | |
| 6,292,395 B1 | 9/2001 | Lin et al. | |
| 6,529,412 B1 | 3/2003 | Chen et al. | |
| 6,791,897 B2 | 9/2004 | Choi et al. | |
| 7,057,921 B2 | 6/2006 | Valet et al. | |
| 7,282,755 B2 * | 10/2007 | Pakala ................... | B82Y 10/00 257/295 |
| 7,403,442 B2 | 7/2008 | Larguier et al. | |

(Continued)

FOREIGN PATENT DOCUMENTS

| | | |
|---|---|---|
| WO | 2012159078 A2 | 11/2012 |
| WO | 2012159078 A3 | 3/2013 |

(Continued)

OTHER PUBLICATIONS

"Giant voltage modulation of magnetic anisotropy in strained heavy metal/magnet/insulator heterostructures", Ong et al., Dec. 2014, included in IDS Dec. 18, 2015.*

(Continued)

*Primary Examiner* — James G Norman
(74) *Attorney, Agent, or Firm* — KPPB LLP

(57) ABSTRACT

Systems and methods in accordance with embodiments of the invention implement efficient magnetoelectric junctions (MEJs). In one embodiment, an MEJ system includes: at least one MEJ, and a first layer including a piezoelectric material disposed proximate at least one MEJ; where the straining of at least some portion of the first layer including a piezoelectric material causes at least some portion of at least one MEJ to experience a stress and a related strain.

15 Claims, 16 Drawing Sheets

(56) References Cited

U.S. PATENT DOCUMENTS

| | | |
|---|---|---|
| 7,480,172 B2 | 1/2009 | Shi et al. |
| 8,213,234 B2 | 7/2012 | Chen et al. |
| 8,482,968 B2 | 7/2013 | Worledge et al. |
| 8,760,930 B1 | 6/2014 | Kushnarenko et al. |
| 8,804,425 B2 | 8/2014 | Chen et al. |
| 8,841,739 B2 | 9/2014 | Khalili Amiri et al. |
| 8,885,395 B2 | 11/2014 | Malmhall et al. |
| 8,891,291 B2 | 11/2014 | Huai et al. |
| 9,099,641 B2 | 8/2015 | Amiri et al. |
| 9,129,691 B2 | 9/2015 | Amiri et al. |
| 9,240,799 B1 | 1/2016 | Wang et al. |
| 9,324,403 B2 | 4/2016 | Amiri et al. |
| 9,355,699 B2 | 5/2016 | Amiri et al. |
| 9,361,975 B2 | 6/2016 | Gilbert et al. |
| 2002/0057594 A1* | 5/2002 | Hirai ............... G11C 11/15 365/171 |
| 2004/0241394 A1 | 12/2004 | Burrows |
| 2005/0036361 A1* | 2/2005 | Fukuzumi ............ H01L 27/228 365/158 |
| 2005/0062082 A1 | 3/2005 | Bucher et al. |
| 2006/0133137 A1* | 6/2006 | Shin ............... G11C 11/15 365/158 |
| 2006/0239110 A1 | 10/2006 | Ueda et al. |
| 2007/0183190 A1 | 8/2007 | Eyckmans et al. |
| 2009/0046529 A1 | 2/2009 | Chen et al. |
| 2010/0080048 A1* | 4/2010 | Liu ............... G11C 11/16 365/157 |
| 2010/0155687 A1 | 6/2010 | Reyes et al. |
| 2010/0277974 A1 | 11/2010 | Yang |
| 2011/0051502 A1 | 3/2011 | Rao et al. |
| 2011/0260224 A1 | 10/2011 | Hidaka |
| 2012/0176831 A1 | 7/2012 | Xiao et al. |
| 2013/0015542 A1 | 1/2013 | Wang et al. |
| 2013/0200323 A1 | 8/2013 | Pham et al. |
| 2013/0343117 A1 | 12/2013 | Lua et al. |
| 2014/0070344 A1 | 3/2014 | Amiri et al. |
| 2014/0071728 A1 | 3/2014 | Khalili et al. |
| 2014/0071732 A1 | 3/2014 | Khalili et al. |
| 2014/0124882 A1 | 5/2014 | Khalili Amiri et al. |
| 2014/0159121 A1 | 6/2014 | Fukami et al. |
| 2014/0169085 A1 | 6/2014 | Wang et al. |
| 2014/0177327 A1 | 6/2014 | Khalili Amiri et al. |
| 2014/0197459 A1 | 7/2014 | Kis et al. |
| 2014/0247653 A1 | 9/2014 | Wang et al. |
| 2014/0334216 A1 | 11/2014 | Wang et al. |
| 2015/0064492 A1* | 3/2015 | Rasic ............... B32B 38/06 428/600 |
| 2015/0122315 A1 | 5/2015 | Hyeonjin et al. |
| 2015/0137289 A1 | 5/2015 | Khalili |
| 2015/0249096 A1 | 9/2015 | Lupino et al. |
| 2015/0332749 A1 | 11/2015 | Khalili et al. |
| 2016/0027842 A1 | 1/2016 | Khalili |
| 2016/0204162 A1 | 7/2016 | Hu et al. |
| 2016/0240771 A1 | 8/2016 | Hu |
| 2016/0358973 A1 | 12/2016 | Katine et al. |
| 2017/0033281 A1 | 2/2017 | Hu |
| 2017/0084322 A1 | 3/2017 | Wang et al. |
| 2017/0323929 A1 | 11/2017 | Bessonov et al. |
| 2017/0372761 A1 | 12/2017 | Lee |
| 2017/0372762 A1 | 12/2017 | Lee |

FOREIGN PATENT DOCUMENTS

| | | |
|---|---|---|
| WO | 2018005698 A1 | 1/2018 |
| WO | 2018005699 A1 | 1/2018 |

OTHER PUBLICATIONS

Alzate, J.G. et al., 56th Conference on Magnetism and Magnetic Materials, Scottsdale, Arizona, USA, EG-11 (2011).

Alzate, J. G. et al., "Voltage-induced switching of nanoscale magnetic tunnel junctions", Conference Paper in Electron Devices Meeting, 1988. IEDM '88. Technical Digest, International, Jan. 2012.

Ong, P. et al., 59th Conference on Magnetism and Magnetic Materials, Honolulu, Hawaii, USA, EE-13 (2014).

Ong, P. et al., "Giant voltage modulation of magnetic anisotropy in strained heavy metal/magnet/insulator heterostructures", Physical Review B 92, 020407(R), Jul. 2015.

Amiri, P.K. et al., Applied Physics Letters 98, 112507 (2011).

Wang, W.G. et al., Nature Materials 11, 64, Jan. 2012.

Shiota, Y. et al., Nature Materials 11, 39, Jan. 2012.

Landau et al., "On the theory of the dispersion of magnetic permeability in ferromagnetic bodies", Ukr. J. Phys., 2008, vol. 53, Special Issue, pp. 14-22.

Lee, C.-H. et al., "Atomically thin p-n. junctions with van der Waals heterointerfaces", Nature Nanotechnology, published online Aug. 10, 2014, vol. 9, pp. 676-681.

Lee, G.-H. et al., "Flexible and Transparent MoS2 Field-Effect Transistors on Hexagonal Boron Nitride-Graphene Heterostructures", ACSNano, published online Aug. 8, 2013, vol. 7, No. 9, pp. 7931-7936.

Lee, Y.-H. et al., "Synthesis of Large-Area MoS2 Atomic Layers with Chemical Vapor Deposition", Advanced Materials, Mar. 30, 2012, vol. 24, pp. 2320-2325.

Lee et al., "A Word Line Pulse Circuit Technique for Reliable Magnetoelectric Random Access Memory", IEEE Transactions on Very Large Scale Integration (VLSI) Systems, Jul. 2017, vol. 25, No. 7, pp. 2027-2034.

Lee et al., "Design of a Fast and Low-Power Sense Amplifier and Writing Circuit for High-Speed MRAM", IEEE Transactions on Magnetics, May 2015, vol. 51, No. 5, 7 pgs.

Lee et al., "Low-Power, High-Density Spintronic Programmable Logic with Voltage-Gated Spin Hall Effect in Magnetic Tunnel Junctions", IEEE Magnetics Letters, May 4, 2016, vol. 7, 5 pgs.

Lee et al., "Source Line Sensing in Magneto-Electric Random-Access Memory to Reduce Read Disturbance and Improve Sensing Margin", IEEE Magnetics Letter, Jun. 20, 2016, vol. 7, 5 pgs.

Li, L. et al., "Black phosphorus field-effect transistors", Nature Nanotechnology, May 2014, vol. 9, pp. 372-377.

Lin, Y.-M. et al., "Wafer-Scale Graphene Integrated Circuit", Science, Jun. 10, 2011. vol. 332, pp. 1294-1297.

Liu, W. et al., "Role of Metal Contacts in Designing High-Performance Monolayer n-Type WSe2 Field Effect Transistors", Nano Letters, Mar. 25, 2013, vol. 13, pp. 1983-1990.

Liu, Leitao et al., "On Monolayer MoS2 Field-Effect Transistors at the Scaling Limit", IEEE Transactions on Electron Devices, vol. 60, No. 12, Dec. 2013, pp. 4133-4139.

Mandelman et al., "Challenges and future directions for the scaling of dynamic random-access Memory (DRAM)", IBM. F. Res & Dev, Mar./May 2002, vol. 46, No. 2/3, pp. 187-212.

Meng et al., "Electric field control of spin re-orientation in perpendicular magnetic tunnel junctions—CoFeB and MgO thickness dependence", Applied Physics Letters, Jul. 31, 2014, vol. 105, pp. 042410-1-042410-5.

Miro, P. et al., "An atlas of two-dimensional materials", Chemical Society Reviews, Mar. 5, 2014, vol. 43, pp. 1983-1990.

Novoselov, K. S., "Electric Field Effect in Atomically Thin Carbon Films", Science, Oct. 22, 2004, vol. 306, pp. 666-669.

Otsuka et al., "a 4Mb conductive-Bridge Resistive Memory with 2.3GB/s Read-Throughput and 216MB/s Program-Throughput", 2011 IEEE International Solid-State Circuits Conference, ISSCC2011, Feb. 22, 2011, pp. 210-211.

Pospischil, A. et al., "Solar-energy conversion and light emission in an atomic monolayer p-n diode", Nature Nanotechnology, published online Mar. 9, 2014, vol. 9, pp. 257-261.

Qazi et al., "Challenges and Directions for Low-Voltage SRAM", IEEE Design & Test of Computers, Jan./Feb. 2011, pp. 32-43.

Radisavljevic, B. et al., "Single-Layer MoS2 Transistors", Nature Nanotechnology, published online Jan. 30, 2011, vol. 6, pp. 147-150.

Rippard et al., "Thermal relaxation rates of magnetic nanoparticles in the presence of magnetic fields and spin-transfer effects", Physical Review B, Aug. 29, 2011, pp. 064439-1-064439-7.

(56) References Cited

OTHER PUBLICATIONS

Roy, T. et al., "Field-Effect Transistors Built from All Two-Dimensional Material Components", ACSNano, published online Apr. 28, 2014, vol. 8, No. 6, pp. 6259-6264.
Shamsi et al., "Reliable and High Performance STT-MRAM Architectures Based on Controllable-Polarity Devices", IEEE International Conference on Computer Design (ICCD), Oct. 18-21, 2015, pp. 343-350.
Shiota et al., "Pulse voltage-induced dynamic magnetization switching in magnetic tunneling junctions with high resistance-area product", Applied Physics Letters, Sep. 5, 2012, vol. 101, pp. 102406-1-102406-4.
Song et al., "Bidirectional Two-Terminal Switching Device for Crossbar Array Architecture", IEEE Electron Device Letters, Aug. 2011, vol. 32, No. 8, pp. 1023-1025.
Tian, H. et al., "Novel Field-Effect Schottky Barrier Transistors Based on Graphene-MoS2 Heterojunctions", Scientific Reports, Aug. 11, 2014, vol. 4, 9 pgs.
Tsuchida et al., "A 64Mb MRAM with Clamped-Reference and Adequate-Reference Schemes", IEEE International Solid-State Circuits Conference, ISSCC 2010/Session 14/ Non-Volatile Memory, Feb. 9, 2010, pp. 258-260.
Wang, H. et al., "Integrated Circuits Based on Bilayer MoS2 Transistors", Nano Letters, Aug. 3, 2012, vol. 12, pp. 4674-4680.
Wang, Q. H., "Electronics and optoelectronics of two-dimensional transition metal dichalcogenides", Nature Nanotechnology, published online Nov. 6, 2012, vol. 7, pp. 699-712.
Wang, X. et al., "Chemical Vapor Deposition Growth of Crystalline Monolayer MoSe2", ACS Nano, published online Mar. 29, 2014, vol. 8, No. 5, pp. 5125-5131.
Wang et al., "Comparative Evaluation of Spin-Transfer-Torque and Magnetoelectric Random Access Memory", IEEE Journal on Emerging and Selected Topics in Circuits and Systems, Jun. 2016, vol. 6, No. 2, pp. 134-145.
Wang et al., "Design and Implementation of dynamic Word-Line Pulse Write Margin Monitor for SRAM", IEEE, Dec. 2-5, 2012, pp. 116-119.
Wang et al., "Low-power non-volatile spintronic memory: STT-RAM and beyond", J. Phys. D: Appl. Phys., Jan. 31, 2013, vol. 46, 10 pgs.
Wang et al., "Magnetoelectric Random Access Memory-Based Circuit Design by Using Voltage-Controlled Magnetic Anisotrophy in Magnetic Tunnel Junctions", IEEE Transactions on Nanotechnology, Nov. 2015, vol. 14, No. 6, pp. 992-997.
Worledge et al., "Spin torque switching of perpendicular Ta | CoFeB | MgO-based magnetic tunnel junctions", Applied Physics Letters, Jan. 10, 2011, vol. 98, pp. 022501-1-022501-3.
Yoshimoto et al., "A 40-nm 8T SRAM with Selective Source Line Control of Read Bitlines and Address Preset Structure", Published in Custom Integrated Circuits Conference (CICC), IEEE, Sep. 22-25, 2013, 4 pgs.
Yu et al., "Highly efficient gate-tunable photocurrent generation in vertical heterostructures of layered materials", Nature Nanotechnology, published online Oct. 27, 2013, vol. 8, pp. 952-958.
Yu et al., "Vertically stacked multi-heterostructures of layered materials for logic transistors and complementary inverters", Nature Materials, published online Dec. 16, 2012, Mar. 2013, vol. 12, pp. 246-252.
Zhan, Y. et al., "Large-Area Vapor-Phase Growth and Characterization of MoS2 Atomic Layers on a Si02 Substrate", Small, Feb. 15, 2012, vol. 8, No. 7, pp. 966-971.
Zhang, Y. et al., "Controlled Growth of High-Quality Monolayer WS2 Layers on Sapphire and Imaging Its Grain Boundary", ACSNano, published online Sep. 18, 2013, vol. 7, No. 10, pp. 8963-8971.
International Search Report and Written Opinion for International Application No. PCT/US2017/039832, Search completed Aug 8, 2017, dated Aug. 29, 2017, 6 Pgs.
International Search Report and Written Opinion for International Application No. PCT/US2017/039833, Search completed Aug 22, 2017, dated Sep. 6, 2017, 22 Pgs.

Akinwande et al., "Two-dimensional flexible nanoelectronics", Nature Communications, Dec. 17, 2014, vol. 5, pp. 1-12.
Amiri et al., "Electric-Field-Controlled Magnetoelectric RAM: Progress, Challenges, and Scaling", IEEE Transactions on Magnetics, Nov. 2015, vol. 51, No. 11, 7 pgs.
Amiri et al., "Electric-field-induced thermally assisted switching of monodomain magnetic bits", Journal of Applied Physics, Jan. 7, 2013, vol. 113, pp. 013912-1-013912-5.
Amiri et al., "Voltage-Controlled Magnetic Anisotropy in Spintronic Devices", Spin, Oct. 29, 2012, vol. 2, No. 3, pp. 1240002-1-1240002-9.
Bae et al., "Roll-to-roll production of 30-inch graphene films for transparent electrodes", Nature Nanotechnology, published online Jun. 20, 2010, vol. 5, pp. 574-578.
Britnell et al., "Resonant tunnelling and negative differential conductance in graphene transistors", Nature Communications, Apr. 30, 2013, vol. 4, 5 pgs.
Britnell et al., "Strong Light-Matter Interactions in Heterostructures of Atomically Thin Films", Science, Jun. 14, 2013, vol. 340, pp. 1311-1314.
Brown, "Thermal Fluctuations of a Single-Domain Particle", Physical Review, Jun. 1, 1963, vol. 130, No. 5, pp. 1677-1686.
Buscema et al., "Photovoltaic effect in few-layer black phosphorus PN junctions defined by local electrostatic gating", Nature Communications, Aug. 28, 2014, vol. 5, 6 pgs.
Butler et al., "Progress, Challenges, and Opportunities in Two-Dimensional Materials Beyond Graphene", ACSNano, Mar. 6, 2013, vol. 7, No. 4, pp. 2898-2926.
Chang et al., "A 0.5V 4Mb Logic-Process compatible Embedded Resistive Ram (ReRAM) in 65nm CMOS Using Low-voltage Current-Mode Sensing Scheme with 45ns Random Read Time", 2012 IEEE International solid-State Circuits Conference, ISSCC 2012, Feb. 22, 2012, pp. 434-436.
Chatterjee et al., "Dual-Source-Line-Bias Scheme to Improve the Read Margin and Sensing Accuracy of STTRAM in Sub-90-nm Nodes", IEEE Transactions on Circuits and Systems—II: Express Briefs, Mar. 8, 2010, vol. 57, No. 3, pp. 208-212.
Chen et al., "A 40 nm fully Functional SRAM with BL Swing and WL Pulse Measurement Scheme for Eliminating a Need for Additional Sensing Tolerance Margins", 2011 Symposium on VLSI Circuits Digest of Technical Papers, Jun. 15-17, 2011, pp. 70-71.
Chen et al., "Compact Measurement Schemes for Bit-Line Swing, Sense Amplifier Offset Voltage, and Word-Line Pulse Width to Characterize Sensing Tolerance Margin in a 30 nm Fully Functional Embedded SRAM", IEEE Journal of Solid-State Circuits, Apr. 2012, vol. 47, No. 4, pp. 969-980.
Choi et al., "Lateral MoS2 p-n Junction Formed by Chemical Doping for Use in High-Performance Optoelectronics", ACSNano, Aug. 18, 2014, vol. 8, No. 9, pp. 9332-9340.
Dorrance et al., "Diode-MTJ Crossbar Memory Cell Using Voltage-Induced Unipolar Switching for High-Density MRAM", IEEE Electron Device Letters, Jun. 2013, vol. 34, No. 6, pp. 753-755.
Fukada et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics, Apr. 20, 2011, vol. 50, pp. 04DE09-1-04DE09-7.
Furchi et al., "Photovoltaic Effect in an Electrically Tunable van der Waals Heterojunction", Nano Letters, Jul. 24, 2014, vol. 14, pp. 4785-4791.
Geim et al., "Van der Waals heterostructures", Nature, Jul. 25, 2013, vol. 499, pp. 419-425.
Georgiou et al., "Vertical field-effect transistor based on graphene-WS2 heterostructures for flexible and transparent electronics", Letters Nature Nanotechnology, published online Dec. 23, 2012, vol. 8, pp. 100-103.
Grezes et al., "Ultra-low switching energy and scaling in electric-field-controlled nanoscale magnetic tunnel junctions with high resistance-area product", Applied Physics Letters, 2016, vol. 108, pp. 012403-1-012403-5.

(56) References Cited

OTHER PUBLICATIONS

Haigh, S. J., "Cross-sectional imaging of individual layers and buried interfaces of graphene-based heterostructures and superlattices", Letters Nature Materials, published online Jul. 29, 2012, Sep. 2012, vol. 11, pp. 764-767.

Halupka et al., "Negative-Resistance Read and Write Schemes for SST-MRAM in 0.13μm CMOS", 2010 IEEE International Solid-State Circuits Conference, ISSCC 2010, Feb. 9, 2010, pp. 256-258.

Huai et al., "Observation of spin-transfer switching in deep submicron-sized and low-resistance magnetic tunnel junctions", Applied Physics Letter, Apr. 19, 2004, vol. 84, No. 16, pp. 3118-3120.

Huang, J.-K. et al., "Large-Area Synthesis of Highly Crystalline WSe2 Monolayers and Device Applications", ACSNano, published online Dec. 14, 2013, vol. 8, No. 1, pp. 923-930.

Ikeda et al., "A perpendicular-anistropy CoFeB-MgO magnetic tunnel junction", Nature Materials, Sep. 2010 (published online Jul. 11, 2010), vol. 9, pp. 721-724.

Ikegami et al., "MTJ-Based "Normally-Off Processors" with Thermal Stability Factor Engineered Perpendicular MTJ, L2 Cache Based on 2T-2MTJ Cell, L3 and Last Level Cache Based on 1T-1MTJ Cell and Novel Error Handling Scheme", IEEE International Electron Devices Meeting (IEDM), Dec. 7-9, 2015, pp. 25.1.1-25.1.4.

Jariwala, D. et al., "Emerging Device Applications for Semiconducting Two-Dimensional Transition Metal Dichalcogenides", ACSNano, published online Jan. 29, 2014, vol. 8, No. 2, pp. 1102-1120.

Kalitsov et al., "Bias dependence of tunneling magnetoresistance in magnetic tunnel junctions with asymmetric barriers", Journal of Physics: Condensed Matter, Nov. 6, 2013, vol. 25, 496005, 8 pgs.

Kanai et al., "Electric field-induced magnetization reversal in a perpendicular-anisotropy CoFeB-MgO magnetic tunnel junction", Applied Physics Letters, Sep. 18, 2012, vol. 101, pp. 122403-1-122403-3.

Kanai et al., "Magnetization switching in a CoFeB/MgO magnetic tunnel junction by combining spin-transfer torque and electric field-effect", Applied Physics Letters, May 30, 2014, vol. 104, pp. 212406-1-212406-3.

Kang et al., "High-Speed, Low-Power, Magnetic Non-Volatile Flip-Flop with voltage-Controlled, Magnetic Anisotropy Assistance", IEEE Magnetics Letters, Nov. 8, 2016, vol. 7, 5 pgs.

Katine et al., "Current-Driven magnetization Reversal and Spin-Wave Excitations in Co/Cu/Co Pillars", Physical Review Letters, Apr. 3, 2000, vol. 84, No. 14, pp. 3149-3152.

Katine et al., "Device implications of spin-transfer torques", Journal of Magnetism and Magnetic Materials, Apr. 2008, vol. 320, pp. 1217-1226.

Kim et al., "Constant-Load Energy Recovery Memory for Efficient High-Speed Operation", International Symposium on Low Power Electronics and Design, ISLPED '04, Aug. 11, 2004, pp. 240-243.

Kobayashi, T. et al., "Production of a 100-m-long high-quality graphene transparent conductive film by roll-to-roll chemical vapor deposition and transfer process", Applied Physics Letters, Jan. 17, 2013, vol. 102, pp. 023112-1-023112-4.

Emori et al., "Large voltage-induced modification of spin-orbit torques in Pt/Co/GdOx", Appl. Phys. Lett. 105, 222401 (2014).

Newhouse-Illige et al., "Voltage-controlled interlayer coupling in perpendicularly magnetized magnetic tunnel junctions", Nat. Commun. 8, 15232 doi: 10.1038/ncomms15232, Published May 16, 2017.

* cited by examiner

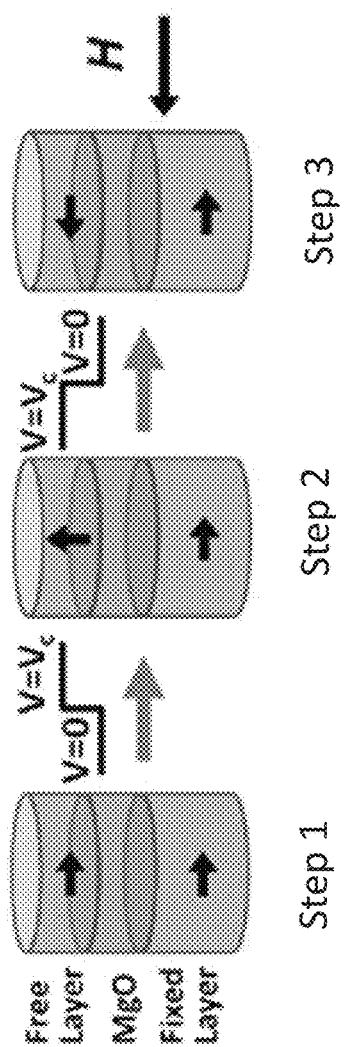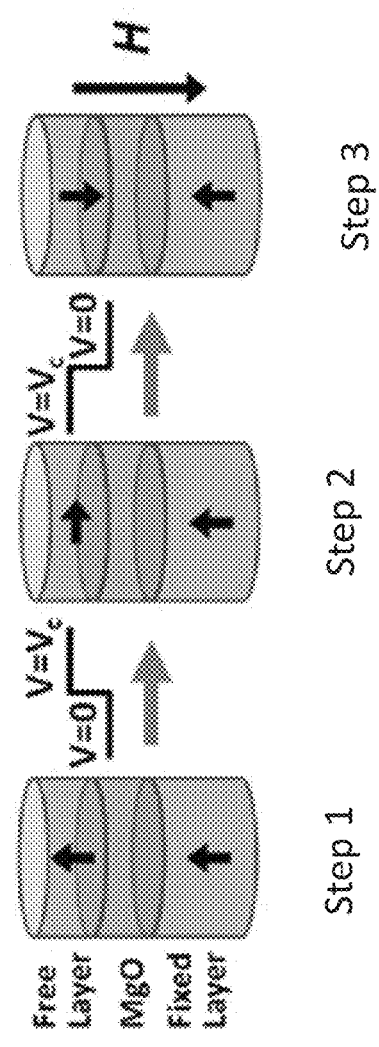

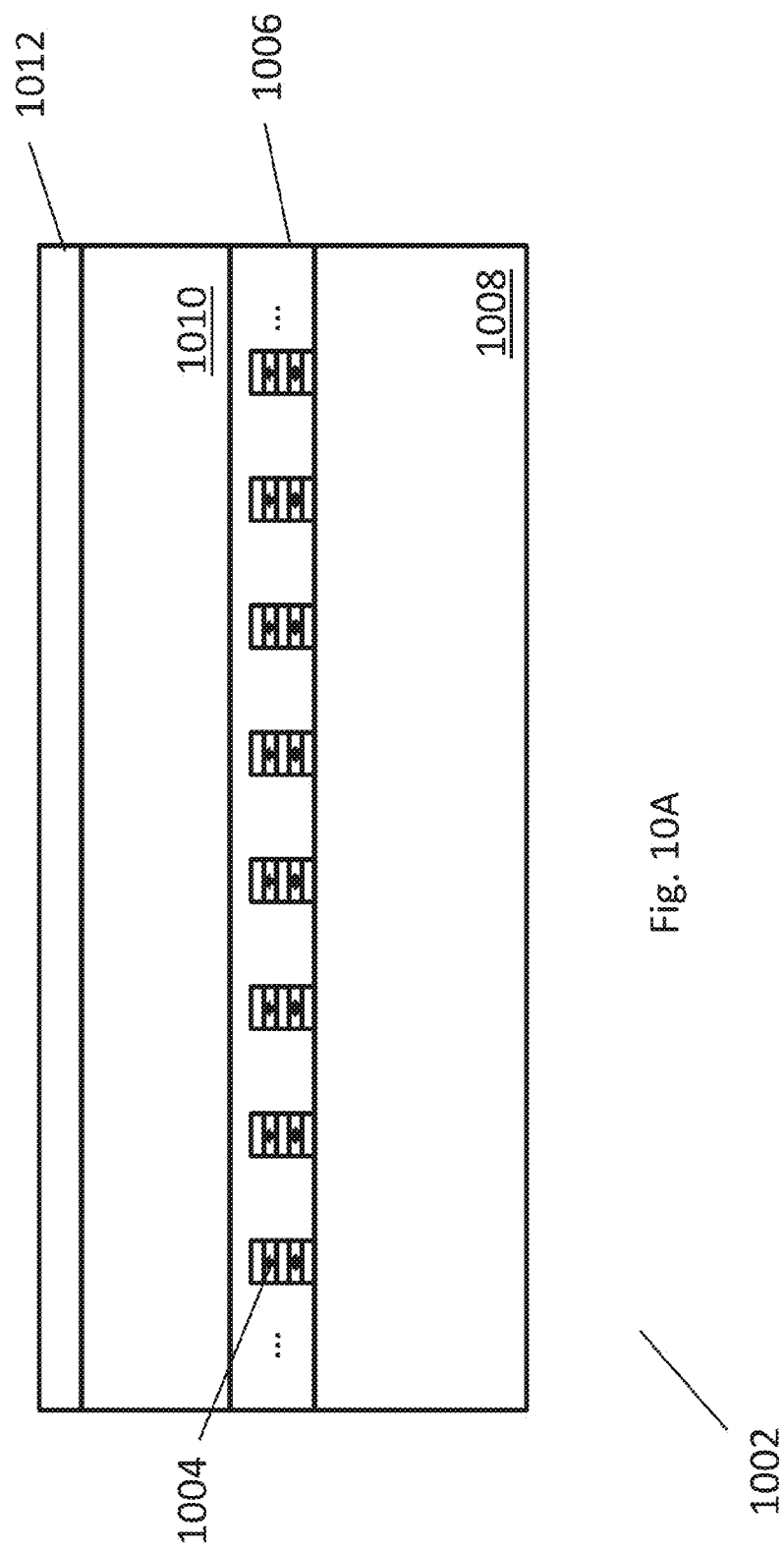

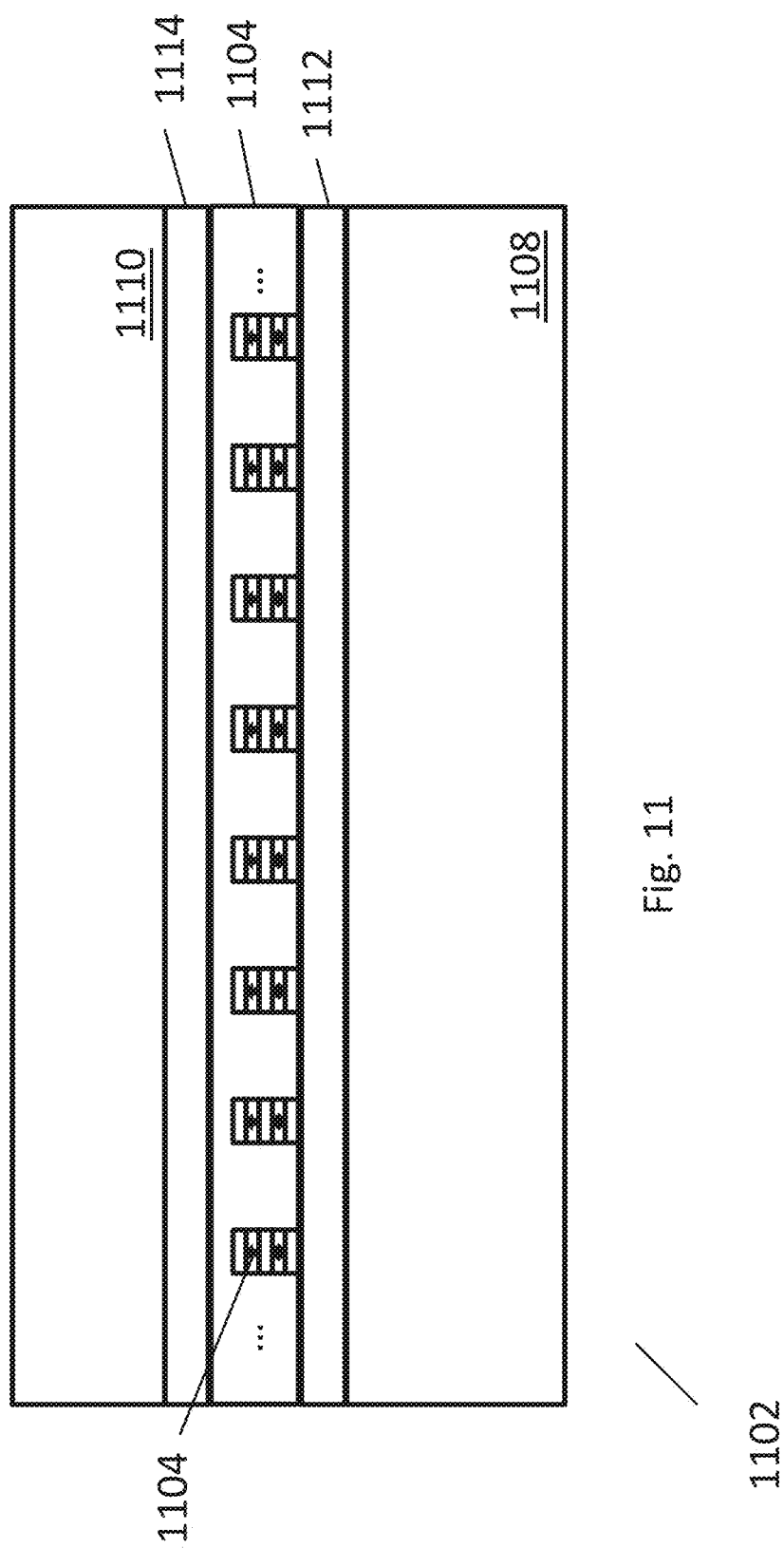

SYSTEMS AND METHODS FOR IMPLEMENTING EFFICIENT MAGNETOELECTRIC JUNCTIONS

CROSS-REFERENCE TO RELATED APPLICATIONS

The current application claims priority to U.S. Provisional Application No. 62/099,948, filed Jan. 5, 2015, the disclosure of which is incorporated herein by reference.

FIELD OF THE INVENTION

The present invention generally relates to the implementation of magnetoelectric junctions.

BACKGROUND OF THE INVENTION

Devices that rely on electricity and magnetism underlie much of modern electronics. Particularly, researchers have begun to develop and implement devices that take advantage of both electricity and magnetism in spin-electronic (or so-called "spintronic") devices. These devices utilize quantum-mechanical magnetoresistance effects, such as giant magnetoresistance (GMR) and tunnel magnetoresistance (TMR). GMR and TMR principles regard how the resistance of a thin film structure that includes alternating layers of ferromagnetic and non-magnetic layers depends upon whether the magnetizations of ferromagnetic layers are in a parallel or antiparallel alignment. For example, magnetoresistive random-access memory (MRAM) is a technology that is being developed that typically utilizes TMR phenomena in providing for alternative random-access memory (RAM) devices. In a typical MRAM bit, data is stored in a magnetic structure that includes two ferromagnetic layers separated by an insulating layer—this structure is conventionally referred to as a magnetic tunnel junction (MTJ). The magnetization of one of the ferromagnetic layers (the fixed layer) is permanently set to a particular direction, while the other ferromagnetic layer (the free layer) can have its magnetization direction free to change. Generally, the MRAM bit can be written by manipulating the magnetization of the free layer such that it is either parallel or antiparallel with the magnetization of the fixed layer; and the bit can be read by measuring its resistance (since the resistance of the bit will depend on whether the magnetizations are in a parallel or antiparallel alignment).

MRAM technologies initially exhibited a number of technological challenges. The first generation of MRAM utilized the Oersted field generated from current in adjacent metal lines to write the magnetization of the free layer, which required a large amount of current to manipulate the magnetization direction of the bit's free layer when the bit size shrinks down to below 100 nm. Thermal assisted MRAM (TA-MRAM) utilizes heating of the magnetic layers in the MRAM bits above the magnetic ordering temperature to reduce the write field. This technology also requires high power consumption and long wire cycles. Spin transfer torque MRAM (STT-MRAM) utilizes the spin-polarized current exerting torque on the magnetization direction in order to reversibly switch the magnetization direction of the free layer. The challenge for STT-MRAM remains that the switching current density needs to be further reduced.

SUMMARY OF THE INVENTION

Systems and methods in accordance with embodiments of the invention implement efficient magnetoelectric junctions.

In one embodiment, a magnetoelectric junction system includes: at least one magnetoelectric junction, itself including, a ferromagnetic fixed layer, a ferromagnetic free layer that is magnetically anisotropic, and a dielectric layer interposed between the ferromagnetic fixed layer and the ferromagnetic free layer, where the ferromagnetic fixed layer is magnetized in a first direction, and where the ferromagnetic free layer can adopt a magnetization direction that is either substantially parallel with or substantially antiparallel with the first direction; and a first layer including a piezoelectric material disposed proximate at least one magnetoelectric junction, where the straining of at least some portion of the first layer including a piezoelectric material causes at least some portion of at least one magnetoelectric junction to experience a stress and a related strain.

In another embodiment, a magnetoelectric junction system further includes a field insulation layer within which the at least one magnetoelectric junction is enveloped.

In yet another embodiment, the field insulation layer includes one of: $SiO_2$, $Al_2O_3$, AlN, $Si_3N_4$, and combinations thereof.

In still another embodiment, a magnetoelectric junction system further includes at least one encapsulating layer that bounds the field insulation layer.

In still yet another embodiment, at least one encapsulating layer includes one of: ZnO, AlN, PZT, PMN-PT, $BaTiO_3$, $BiFeO_3$, and combinations thereof.

In a further embodiment, the first layer including a piezoelectric material is an encapsulating layer.

In a yet further embodiment, the first layer including a piezoelectric material is separate from an encapsulating layer.

In a still further embodiment, at least one of the field insulation, the first layer including a piezoelectric, and the encapsulating layer is characterized by a Young's modulus of less than 100 GPa.

In a still yet further embodiment, at least two electrodes that can cause the application of a potential difference are coupled to the first layer including a piezoelectric material such that the application of a potential difference to the first layer can cause a lateral straining of the first layer.

In another embodiment, the first layer including a piezoelectric material defines an upper surface and a lower surface, and a first electrode is coupled to the upper surface, and a second electrode is coupled to the lower surface.

In yet another embodiment, a magnetoelectric junction system further includes a second layer including a piezoelectric material disposed proximate at least one magnetoelectric junction, where the straining of at least some portion of the second layer including a piezoelectric material causes at least some portion of at least one magnetoelectric junction to experience a stress and a related strain.

In still another embodiment, a magnetoelectric junction defines a seed layer that is proximate the free layer, and where the straining of at least some portion of the first layer including a piezoelectric material causes at least some portion of the seed layer, the free layer, and/or the dielectric layer to relatedly to experience a stress and a related strain.

In still yet another, a magnetoelectric junction system further includes an externally applied magnetic field that is characterized by a magnetic direction that is substantially parallel with or substantially antiparallel with the first direction, where the externally applied magnetic field has a sufficient strength to cause the ferromagnetic free layer to adopt the magnetic direction of the externally applied magnetic field when the coercivity of the ferromagnetic free layer has been reduced by the application of a potential difference across the associated magnetoelectric junction and the magnetoelectric junction is being strained.

In a further embodiment, a magnetoelectric junction system further includes a metal line disposed adjacent to at least one magnetoelectric junction, where the adjacent metal line can induce spin-orbit torques or Osterd field that can cause the ferromagnetic free layer to adopt a particular magnetization direction.

In a still further embodiment, the at least one magnetoelectric junction is configured such that when a potential difference is applied across the magnetoelectric junction, the strength of the magnetic anisotropy in a direction perpendicular to the plane of the free layer is modified, and the magnetization direction of the free layer is relatedly modified, for the duration of the application of the potential difference.

In a yet further embodiment, a method of efficiently operating at least one magnetoelectric junction includes: applying a potential difference to a layer including a piezoelectric material that is directly or indirectly adjoined to at least one magnetoelectric junction so as to cause the straining of at least one magnetoelectric junction; and applying a potential difference across the at least one magnetoelectric junction so as to reduce the coercivity of the free layer within the at least one magnetoelectric junction.

BRIEF DESCRIPTION OF THE DRAWINGS

FIGS. 5A and 5B illustrate the operation of an MEJ in accordance with certain embodiments of the invention.

FIGS. 10A and 10B illustrate MEJ systems that include a layer including a piezoelectric material that is distinct from a separate upper encapsulating layer in accordance with certain embodiments of the invention.

FIG. 11 illustrates an MEJ system that includes a plurality of layers including piezoelectric materials in accordance with certain embodiments of the invention.

DETAILED DESCRIPTION

Figure 1:
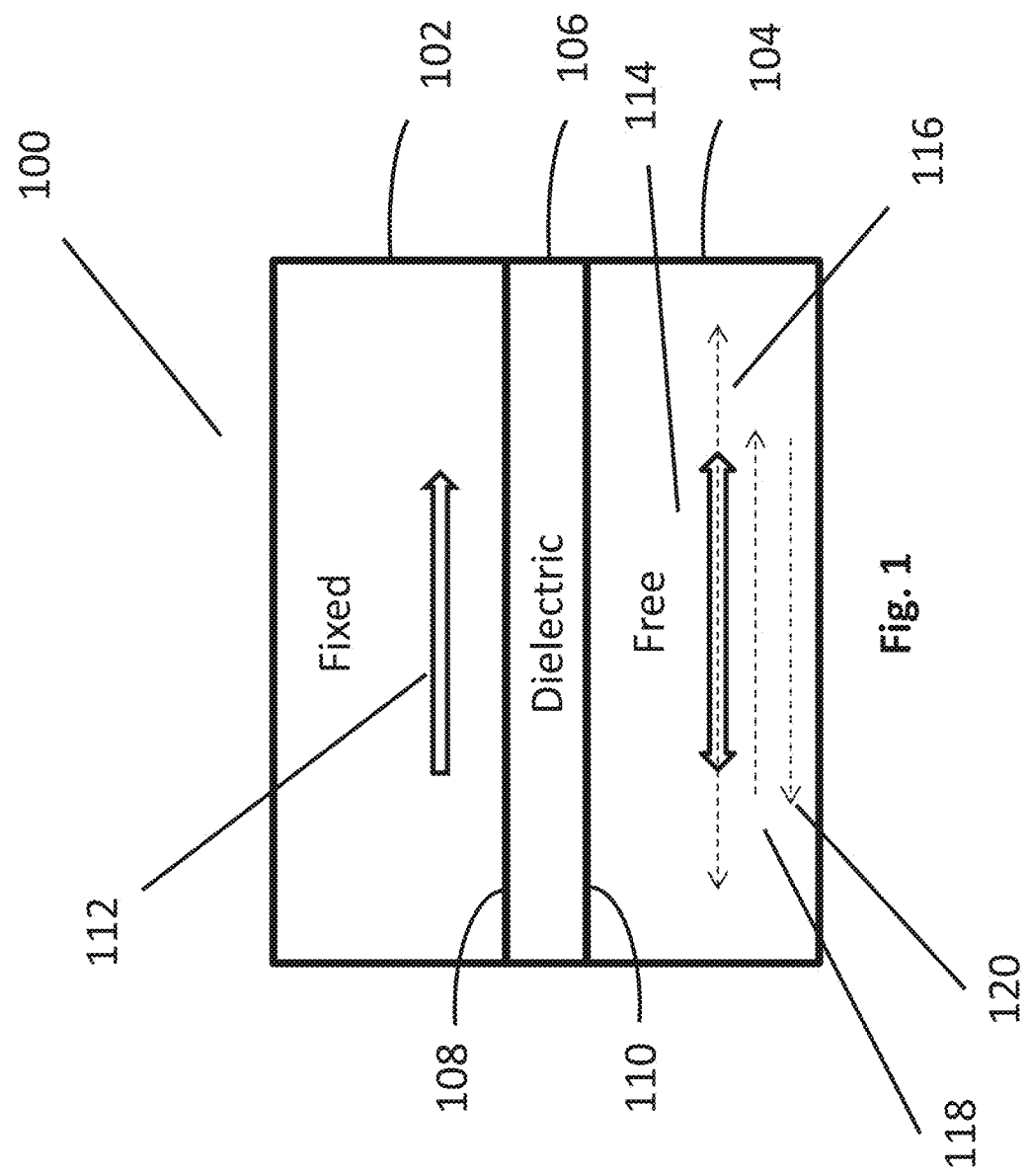
FIG. 1 illustrates an MEJ that includes in-plane magnetization in accordance with certain embodiments of the invention.

Turning now to the drawings, systems and methods for implementing efficient magnetoelectric junctions are illustrated. In many embodiments, at least one constituent component of a magnetoelectric junction is under the influence of strain. In numerous embodiments, at least one magnetoelectric junction is adjoined, either directly or indirectly, to a piezoelectric material, such that a voltage can be applied to the piezoelectric material and cause it to strain at least one constituent component of the magnetoelectric junction.

Previous efforts at implementing electromagnetic components that utilize magnetoresistance phenomena to achieve two information states (i.e. one bit of information), e.g. magnetic tunnel junctions (MTJs), were largely directed at using a current to manipulate the magnetization configuration (e.g. whether the magnetization directions of the fixed layer and the free layer are parallel or anti-parallel to each other) of the magnetic layers in the device. However, the currents required were often considerably large, particularly in cases where MTJs were used in MRAM configurations. Indeed, in applications that require low-power operation, the requirement of a considerably large current made the implementation of devices that rely on MTJs less commercially viable. Accordingly, voltage-controlled magnetic anisotropy-based MTJs (VMTJs) that generally allow MTJs to utilize an electric field to facilitate the switching of the magnetization direction of the free layer (i.e., 'write' to it) as opposed to (or in some cases, in addition to) using a current to do so were developed and reported. See e.g., International Patent Application Number PCT/US2012/038693, entitled "Voltage-Controlled Magnetic Anisotropy (VCMA) Switch and Magneto-electric Memory (MERAM)," by Khalili Amiri et al., the disclosure of which is herein incorporated by reference in its entirety. Generally, the coercivity of the free layer of an MTJ can be reduced using voltage-controlled magnetic anisotropy (VCMA) phenomena, thereby making the free layer more easily switched to the opposite direction ('writeable'). It has been demonstrated that such devices employing VCMA principles result in marked performance improvements over conventional MTJs. Note that in the instant application, the term 'magnetoelectric junction' (MEJ) is used to refer to devices that use VCMA principles to help them realize two distinct information states, e.g. voltage-controlled magnetic anisotropy-based MTJs (VMTJs) as well as the VCMA switches disclosed in International Patent Application Number PCT/US2012/038693, cited above.

In many instances, a fundamental MEJ includes a ferromagnetic fixed layer, a ferromagnetic free layer, and a dielectric layer interposed between said ferromagnetic fixed layer and ferromagnetic free layer. The ferromagnetic fixed layer generally has a fixed magnetization direction, whereas the ferromagnetic free layer can adopt a magnetization direction that is either substantially parallel with or antiparallel with the ferromagnetic fixed magnetization direction. In many instances, the application of a potential difference across the MEJ invokes VCMA phenomena and thereby allows the free layer to be 'switched' in a desired direction (i.e. the direction of magnetization can be defined as desired, e.g. either substantially parallel with or antiparallel with the magnetization of the fixed layer); thus, the free layer can adopt a magnetization direction either parallel with or antiparallel with the magnetization direction of the fixed magnet. In accordance with tunnel magnetoresistance ("TMR") principles, the resistance of the MEJ will vary depending upon whether the free layer adopts a parallel or an antiparallel magnetization direction relative to the fixed layer, and therefore, the MEJ can define two information states (i.e. one bit of information). An MEJ can thereby be 'read,' i.e. whether its ferromagnetic layers have magnetization directions that are parallel or antiparallel can be determined, by measuring the resistance across it. Thus, it can be seen that generally, VCMA phenomena can be used to facilitate 'writing' to an MEJ, while TMR effects can generally allow an MEJ to be 'read.'

While MEJs demonstrate much promise, their potential applications continue to be explored. For example, U.S. Pat. No. 8,841,739 (the '739 patent) to Khalili Amiri et al. discloses DIOMEJ cells that utilize diodes (e.g. as opposed to transistors) as access devices to MEJs. As discussed in the '739 patent, using diodes as access devices for MEJs can confer a number of advantages and thereby make the implementation of MEJs much more practicable. The disclosure of the '739 patent is hereby incorporated by reference in its entirety, especially as it pertains to implementing diodes as access devices for MEJs. Furthermore, U.S. patent application Ser. No. 14/073,671 ("the '671 patent application") to Khalili Amiri et al. discloses MEJ configurations that demonstrate improved writeability and readability, and further make the implementation of MEJs more practicable. The disclosure of the '671 patent application is hereby incorporated by reference in its entirety, especially as it pertains to MEJ configurations that demonstrate improved writeability and readability.

Recently, it has been demonstrated that, by straining the constituent components of an MEJ, the MEJ can operate using a much lower 'switching voltage.' (See e.g., P. V. Ong, et al., "*Giant Magnetoelectric Effect in Strained Heavy Metal/Magnet/Insulator Hetero structures*"). The disclosure of *Giant Magnetoelectric Effect in Strained Heavy Metal/Magnet/Insulator Heterostructures* is hereby incorporated by reference in its entirety, especially as it pertains to the application of strain to influence switching voltages. For example, the voltage required to switch can be reduced by a factor of 10, relative to that if the constituent components are not strained. Accordingly, in many embodiments, particularly efficacious and efficient techniques for implementing strain within constituent MEJ components are implemented. For example, in a number of embodiments, at least one MEJ is adjoined, either directly or indirectly, to a piezoelectric material such that when a potential difference is applied across the piezoelectric material, the piezoelectric material is strained, and the at least one MEJ that is adjoined either directly or indirectly to it is correspondingly strained. The extent to which the piezoelectric material causes the at least one MEJ to be strained can be made to be a function of the potential difference that is applied to the piezoelectric material. In this way, the extent to which the at least one MEJ is strained can be controlled, i.e. the extent to which the at least one MEJ is strained is tunable. These and other techniques will be described in greater detail below. But first, fundamental MEJ structures and their operating principles are now discussed in greater detail.

Fundamental Magnetoelectric Junction Structures

A fundamental MEJ structure typically includes a ferromagnetic (FM) fixed layer, a FM free layer that has a uniaxial anisotropy (for simplicity, the terms "FM fixed layer" and "fixed layer" will be considered equivalent throughout this application, unless otherwise stated; similarly, the terms "FM free layer", "ferromagnetic free layer," "free layer that has a uniaxial anisotropy", and "free layer" will also be considered equivalent throughout this application, unless otherwise stated), and a dielectric layer separating the FM fixed layer and FM free layer. Generally, the FM fixed layer has a fixed magnetization direction, i.e. the direction of magnetization of the FM fixed layer does not change during the normal operation of the MEJ. Conversely, the FM free layer can adopt a magnetization direction that is either substantially parallel with or antiparallel with the FM fixed layer, i.e. during the normal operation of the MEJ, the direction of magnetization can be made to change. For example, the FM free layer may have a magnetic uniaxial anisotropy, whereby it has an easy axis that is substantially aligned with the direction of magnetization of the FM fixed layer. The easy axis refers to the axis, along which the magnetization direction of the layer prefers to align. In other words, an easy axis is an energetically favorable direction (axis) of spontaneous magnetization that is determined by various sources of magnetic anisotropy including, but not limited to, magnetocrystalline anisotropy, magnetoelastic anisotropy, geometric shape of the layer, etc. Relatedly, an easy plane is a plane whereby the direction of magnetization is favored to be within the plane, although there is no bias toward a particular axis within the plane. The easy axis and the direction of the magnetization of the fixed layer can be considered to be 'substantially aligned' when—in the case where the magnetization direction of the free layer conforms to the easy axis—the underlying principles of magnetoresistance take effect and result in a distinct measurable difference in the resistance of the MEJ as between when the magnetization directions of the FM layers are substantially parallel relative to when they are substantially antiparallel, e.g. such that two distinct information states can be defined. Similarly, the magnetization directions of the fixed layer and the free layer can be considered to be substantially parallel/antiparallel when the underlying principles of magnetoresistance take effect and result in a distinct measurable distance in the resistance of the MEJ as between the two states (i.e. substantially parallel and substantially antiparallel).

VCMA phenomena can be relied on in switching the FM free layer's characteristic magnetization direction, i.e. the MEJ can be configured such that the application of a potential difference across the MEJ can reduce the coercivity of the free layer, which can allow the free layer's magnetization direction to be switched more easily. In other words, with a reduced coercivity, the FM free layer can be subject to magnetization that can make it substantially parallel with or substantially antiparallel with the direction of the magnetization for the FM fixed layer. A more involved discussion regarding the general operating principles of an MEJ is presented in the following section.

Notably, the magnetization direction, and the related characteristics of magnetic anisotropy, can be established for the FM fixed and FM free layers using any suitable method. For instance, the shapes of the constituent FM fixed layer, FM free layer, and dielectric layer, can be selected based on desired magnetization direction orientations. For example, implementing FM fixed, FM free, and dielectric layers that have an elongated shape, e.g. have an elliptical cross-section, may tend to induce magnetic anisotropy that is in the direction of the length of the elongated axis—i.e. the FM fixed and FM free layers will possess a tendency to adopt a direction of magnetization along the length of the elongated axis. In other words, the direction of the magnetization is 'in-plane'. Alternatively, where it is desired that the magnetic anisotropy have a directional component that is perpendicular to the FM fixed and FM free layers (i.e., 'out-of-plane'), the shape of the layers can be made to be symmetrical, e.g. circular, and further the FM layers can be made to be thin. In this case, while the tendency of the magnetization to remain in-plane may still exist, it may not have a preferred directionality within the plane of the layer. Because the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy, i.e. an anisotropy originating from its bulk (volume) rather than from its interfaces with other adjacent layers. The FM free or fixed layers may also consist of a number of sub-layers, with the interfacial anisotropy between individual sub-layers giving rise to an effective bulk anisotropy to the material as a whole. Additionally, FM free or fixed layers may be constructed which combine these effects, and for example have both interfacial and bulk contributions to perpendicular anisotropy.

FIG. 1 illustrates an MEJ whereby the FM fixed layer and the FM free layer are separated by, and directly adjoined to, a dielectric layer. In particular, in the illustrated embodiment, the MEJ 100 includes an FM fixed layer 102 that is adjoined to a dielectric layer 106, thereby forming a first interface 108; the MEJ further includes an FM free layer 104 that is adjoined to the dielectric layer 106 on an opposing side of the first interface 108, and thereby forms a second interface 110. The MEJ 100 has an FM fixed layer 102 that has a magnetization direction 112 that is in-plane, and depicted in the illustration as being from left to right. Accordingly, the FM free layer is configured such that it can adopt a magnetization direction 114 that is either parallel with or antiparallel with the magnetization direction of the FM fixed layer. For reference, the easy axis 116 is illustrated, as well as a parallel magnetization direction 118, and an antiparallel magnetization direction 120. Additional contacts (capping or seed materials, or multilayers of materials, not shown) may be attached to the FM free layer 104 and the FM fixed layer 102, thereby forming additional interfaces. The contacts both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

Importantly, by appropriately selecting the materials, the MEJ can be configured such that the application of a potential difference across the FM fixed layer and the FM free layer can modify the magnetic anisotropy of the FM free layer. For example, whereas in FIG. 1, the magnetization direction of the FM free layer is depicted as being in-plane, the application of a voltage may distort the magnetization direction of the FM free layer such that it includes a component that is at least partially out of plane. The particular dynamics of the modification of the magnetic anisotropy will be discussed below in the section entitled "MEJ Operating Principles." Suitable materials for the FM layers such that this effect can be implemented include iron, nickel, manganese, cobalt, FeCoB, FeGaB, FePd, and FePt; further, any compounds or alloys that include these materials may also be suitable. Suitable materials for the dielectric layer include MgO and $Al_2O_3$. Of course, it should be understood that the material selection is not limited to those recited—any suitable FM material can be used for the FM fixed and free layers, and any suitable material can be used for the dielectric layer. It should also be understood that each of the FM free layer, FM fixed layer, and dielectric layer may consist of a number of sub-layers, which acting together provide the functionality of the respective layer.

Figure 2:
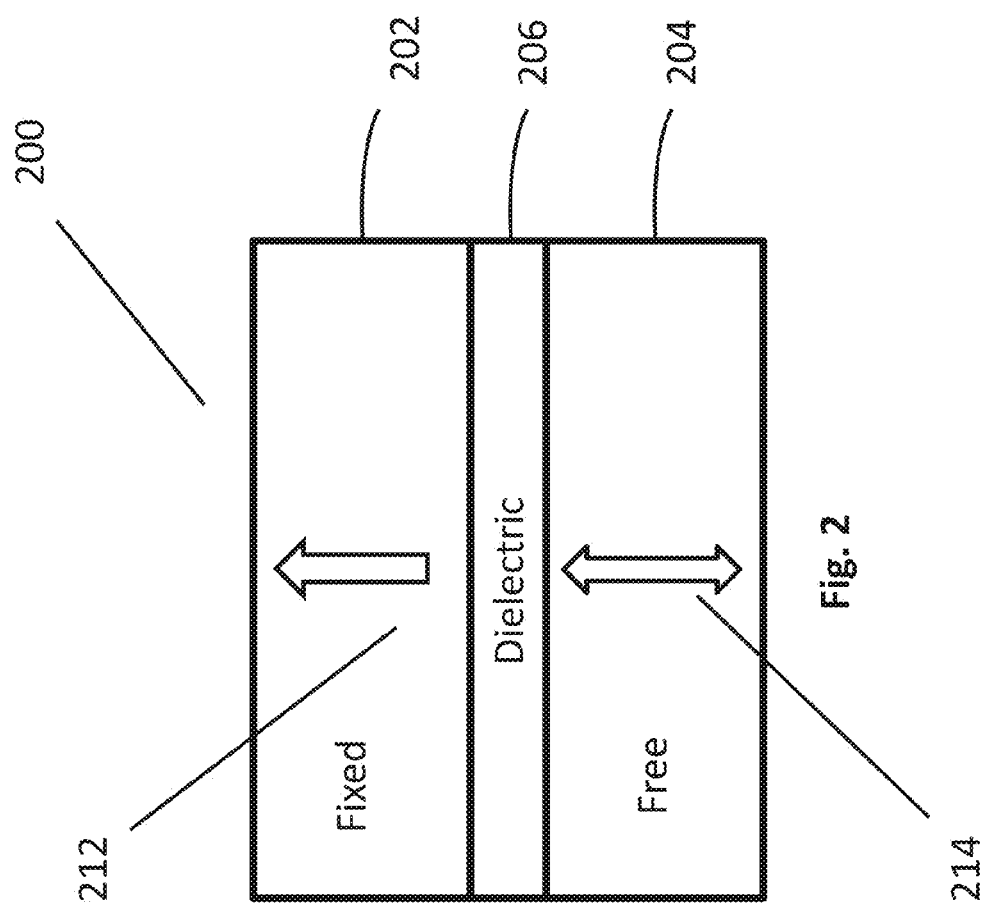
FIG. 2 illustrates an MEJ that includes out of plane magnetization in accordance with certain embodiments of the invention.

FIG. 2 illustrates an MEJ whereby the orientation of the magnetization directions is perpendicular to the plane of the constituent layers. In particular, the MEJ 200 is similarly configured to that seen in FIG. 1, with an FM fixed layer 202 and an FM free layer 204 adjoined to a dielectric layer 206. However, unlike the MEJ in FIG. 1, the magnetization directions of the FM fixed and FM free layers, 212 and 214 respectively, are oriented perpendicularly to the layers of the MEJ. Additional contacts (capping or seed materials, or multilayers of materials, not shown) may be attached to the FM free layer 204 and the FM fixed layer 202, thereby forming additional interfaces. The contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together provide the functionality of the respective layer.

Of course, it should be understood that the direction of magnetization for the FM layers can be in any direction, as long as the FM free layer can adopt a direction of magnetization that is either substantially parallel with or antiparallel with the direction of magnetization of the FM fixed layer. For example, the direction of magnetization can include both in-plane and out-of-plane components.

In many instances, an MEJ includes additional adjunct layers that function to facilitate the operation of the MEJ. For example, in many instances, the FM free layer includes a capping or seed layer, which can (1) help induce greater electron spin perpendicular to the surface of the layer, thereby increasing its perpendicular magnetic anisotropy, and/or (2) can further enhance the sensitivity to the application of an electrical potential difference.

Figure 3:
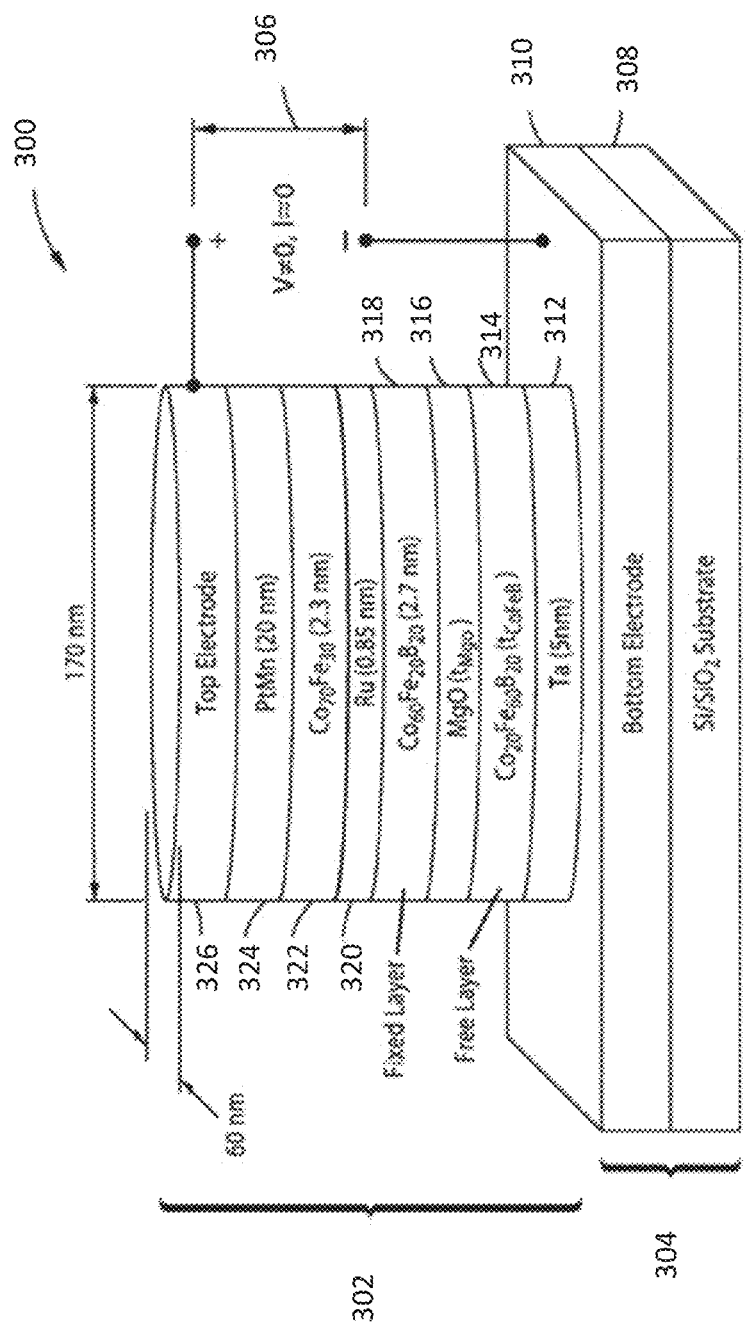
FIG. 3 illustrates an MEJ that includes adjunct layers to facilitate its operation in accordance with embodiments of the invention.

FIG. 3 illustrates an MEJ 300 that includes multiple layers that work in aggregate to facilitate the functionality of the MEJ 300. A pillar section 302 extends from a planar section 304. A voltage is shown being applied 306 between the top and bottom of the pillar. By way of example, a $Si/SiO_2$ substrate 308 is seen over which is a bottom electrode 310. The pillar 302 comprises the following layers in order: Ta 312 (e.g., 5 nm in thickness); a free layer 314 preferably comprising an Fe-rich CoFeB material (e.g. $Co_{20}Fe_{60}B_{20}$ having a thickness generally ranging from, but not limited to, 0.8 nm-1.6 nm); a dielectric layer 316 comprising a dielectric oxide such as MgO or $Al_2O_3$ having a thickness of approximately, but not limited to, 0.8-1.4 nm); a FM fixed layer 318 preferably comprising a CoFeB material (e.g. $Co_{60}Fe_{20}B_{20}$ having a thickness of approximately, but not limited to, 2.7 nm); a metal layer (e.g. Ru 320 having a thickness of approximately, but not limited to, 0.85 nm) to provide antiferromagnetic inter-layer exchange coupling; an exchange-biased layer 322 of $Co_{70}Fe_{30}$ (e.g., thickness of approximately, but not limited to, 2.3 nm), the magnetization orientation of which is pinned by exchange bias using an anti-ferromagnetic layer 324, e.g. PtMn, IrMn, or a like material having a thickness of approximately, but not limited to, 20 nm); and a top electrode 326. By way of example and not limitation, the pillar of the device depicted is in the shape of a 170 nm×60 nm elliptical nanopillar. In this illustration, Ta layer 312 is used as a seed layer to help induce a larger magnitude of perpendicular magnetic anisotropy and/or enhance the electric-field sensitivity of magnetic properties (such as anisotropy) in the FM free layer. It also acts as a sink of B atoms during annealing of the material stack after deposition, resulting in better crystallization of the FM free layer and thereby increasing the TMR and/or VCMA effect. Of course any suitable materials can be used as a capping or seed layer 312; for example, materials based on ruthenium, hafnium, and palladium, may be used. More generally, any adjunct layers that can help facilitate the proper functioning of the MEJ can be implemented in an MEJ.

MEJs can also include a semi-fixed layer which has a magnetic anisotropy that is altered by the application of a potential difference. In many instances the characteristic magnetic anisotropy of the semi-fixed layer is a function of the applied voltage. For example in many cases, the direction of the magnetization of the semi-fixed layer is oriented in the plane of the layer in the absence of a potential difference across the MEJ. However, when a potential difference is applied, the magnetic anisotropy is altered such that the magnetization includes a strengthened out-of-plane component. Moreover, the extent to which the magnetic anisotropy of the semi-fixed layer is modified as a function of applied voltage can be made to be less than the extent to which the magnetic anisotropy of the FM free layer is modified as a function of applied voltage. The incorporation of a semi-fixed layer can facilitate a more nuanced operation of the MEJ (to be discussed below in the section entitled "MEJ Operating Principles").

Figure 4A:
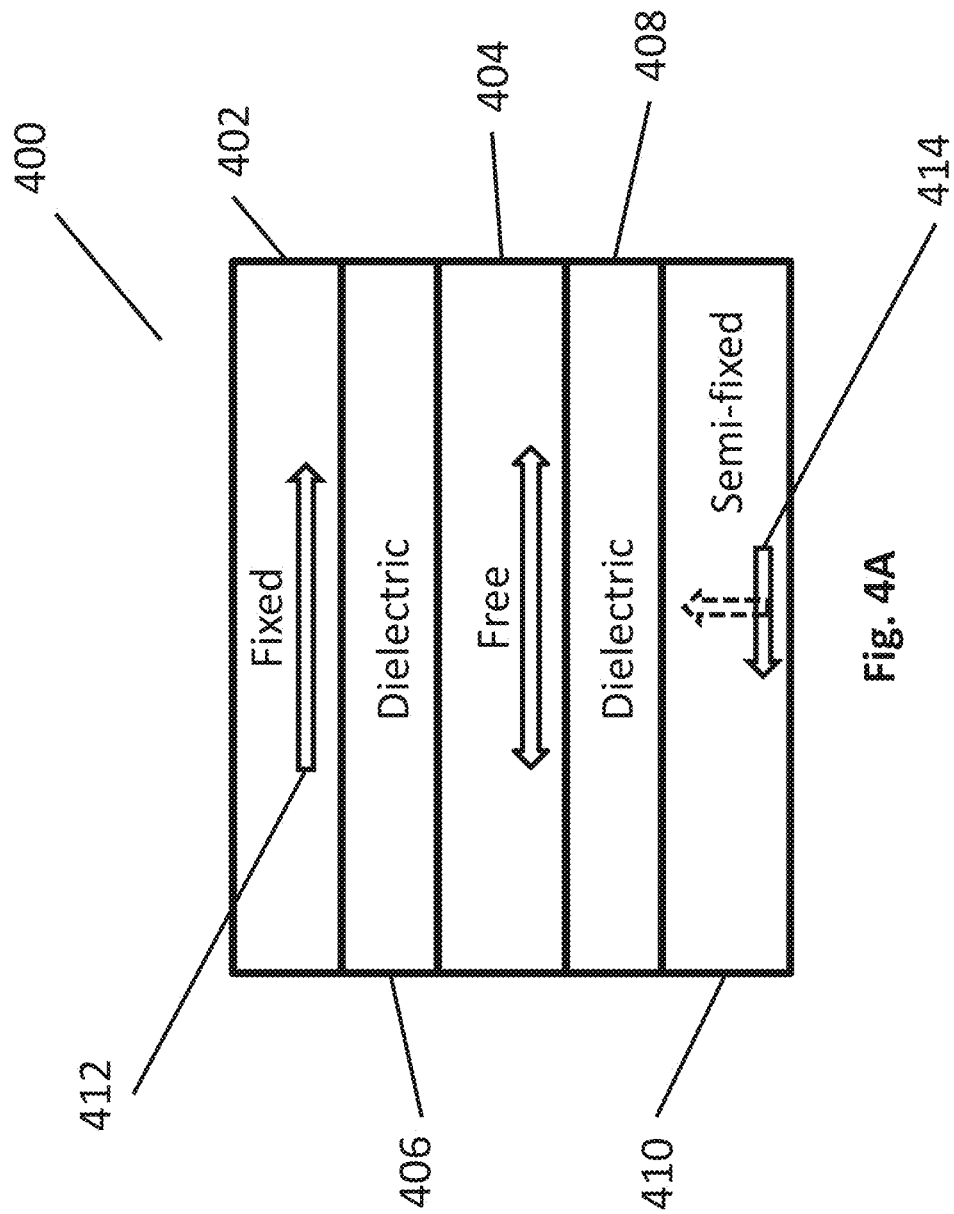
FIGS. 4A and 4B illustrate MEJs that include a semi-fixed layer in accordance with certain embodiments of the invention.
Figure 4B:
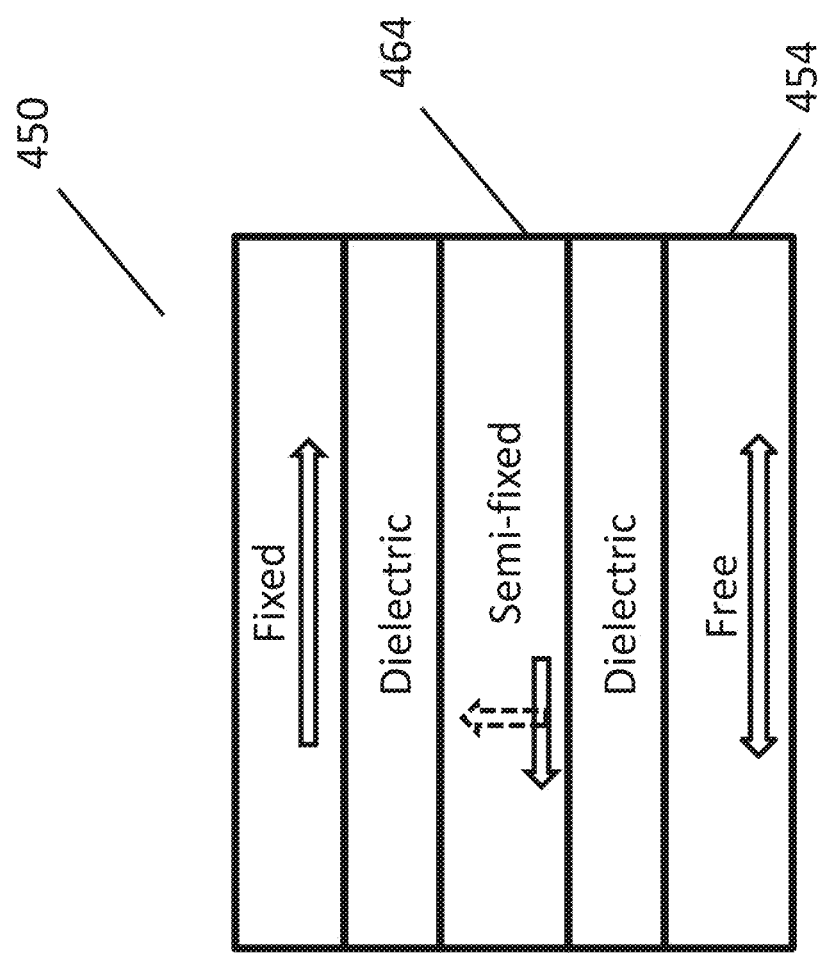

FIG. 4A illustrates an MEJ that includes a semi-fixed layer. In particular, the configuration of the MEJ 400 is similar to that depicted in FIG. 1, insofar as it includes an FM fixed layer 402 and an FM free layer 404 separated by a dielectric layer 406. However, the MEJ 400 further includes a second dielectric layer 408 adjoined to the FM free layer 404 such that the FM free layer is adjoined to two dielectric layers, 406 and 408 respectively, on opposing sides. Further, a semi-fixed layer 410 is adjoined to the dielectric layer. Typically, the direction of magnetization of the semi-fixed layer 414 is antiparallel with that of the FM fixed layer 412. As mentioned above, the direction of magnetization of the semi-fixed layer can be manipulated based on the application of a voltage. In the illustration, it is depicted that the application of a potential difference adjusts the magnetic anisotropy of the semi-fixed layer such that the strength of the magnetization along a direction orthogonal to the initial direction of magnetization (in this case, out of the plane of the layer) is developed. It should of course be noted that the application of a potential difference can augment the magnetic anisotropy in any number of ways; for instance, in some MEJs, the application of a potential difference can reduce the strength of the magnetization in a direction orthogonal to the initial direction of magnetization. Note also that in the illustration, the directions of magnetization are all depicted to be in-plane where there is no potential difference. However, of course it should be understood that the direction of the magnetization can be in any suitable direction. More generally, although a particular configuration of an MEJ that includes a semi-fixed layer is depicted, it should of course be understood that a semi-fixed layer can be incorporated within an MEJ in any number of configurations. For example, FIG. 4B illustrates an MEJ that includes a semi-fixed layer that is in a different configuration than that seen in 4A. In particular, the MEJ 450 is similar to that seen in FIG. 4A, except that the positioning of the semi-fixed layer 464 and the free layer 454 is inverted. In certain situations, such a configuration may be more desirable.

The general principles of the operation of an MEJ are now discussed.

General Principles of MEJ Operation

MEJ operating principles—as they are currently understood—are now discussed. Note that embodiments of the invention are not constrained to the particular realization of these phenomena. Rather, the presumed underlying physical phenomena are being presented to inform the reader as to how MEJs are believed to operate. MEJs generally function to achieve two distinct states using the principles of magnetoresistance. As mentioned above, magnetoresistance principles regard how the resistance of a thin film structure that includes alternating layers of ferromagnetic and non-magnetic layers depends upon whether the ferromagnetic layers are in a substantially parallel or antiparallel alignment. Thus, an MEJ can achieve a first state where its FM layers have magnetization directions that are substantially parallel, and a second state where its FM layers have magnetization directions that are substantially antiparallel. MEJs further rely on voltage-controlled magnetic anisotropy (VCMA) phenomena. Generally, VCMA phenomena regard how the application of a voltage to a ferromagnetic material that is adjoined to an adjacent dielectric layer can impact the characteristics of the ferromagnetic material's magnetic anisotropy. For example, it has been demonstrated that the interface of oxides such as MgO with metallic ferromagnets such as Fe, CoFe, and CoFeB can exhibit a large perpendicular magnetic anisotropy which is furthermore sensitive to voltages applied across the dielectric layer, an effect that has been attributed to spin-dependent charge screening, hybridization of atomic orbitals at the interface, and to the electric field induced modulation of the relative occupancy of atomic orbitals at the interface. MEJs can exploit this phenomenon to achieve two distinct states. For example, MEJs can employ one of two mechanisms to do so: first, MEJs can be configured such that the application of a potential difference across the MEJ functions to reduce the coercivity of the FM free layer, such that it can be subject to magnetization in a desired magnetic direction, e.g. either substantially parallel with or antiparallel with the magnetization direction of the fixed layer; second, MEJ operation can rely on precessional switching (or resonant switching), whereby by precisely subjecting the MEJ to voltage pulses of precise duration, the direction of magnetization of the FM free layer can be made to switch.

In many instances, MEJ operation is based on reducing the coercivity of the FM free layer such that it can adopt a desired magnetization direction. With a reduced coercivity, the FM free layer can adopt a magnetization direction in any suitable way. For instance, the magnetization can result from: an externally applied magnetic field, the magnetic field of the FM fixed layer; the application of a spin-transfer torque (STT) current; the magnetic field of a FM semi-fixed layer; the application of a current in an adjacent metal line inducing a spin-orbit torque (SOT); and any combination of these mechanisms, or any other suitable method of magnetizing the FM free layer with a reduced coercivity.

By way of example and not limitation, examples of suitable ranges for the externally applied magnetic field are in the range of 0 to 100 Oe. The magnitude of the electric field applied across the device to reduce its coercivity or bring about resonant switching can be approximately in the range of 0.1-2.0 V/nm, with lower electric fields required for materials combinations that exhibit a larger VCMA effect.

The magnitude of the STT current used to assist the switching may be in the range of approximately 0.1-1.0 MA/cm².

FIG. 5A depicts how the application of a potential difference can reduce the coercivity of the free layer such that an externally applied magnetic field H can impose a magnetization switching on the free layer. In the illustration, in step 1, the FM free layer and the FM fixed layer have a magnetization direction that is substantially in plane; the FM free layer has a magnetization direction that is parallel with that of the FM fixed layer. Further, in Step 1, the coercivity of the FM free layer is such that the FM free layer is not prone to having its magnetization direction reversed by the magnetic field H, which is in a direction antiparallel with the magnetization direction of the FM fixed layer. However, a Voltage, $V_c$ is then applied, which results in step 2, where the voltage $V_c$ has magnified the perpendicular magnetization direction component of the free layer (out of its plane). Correspondingly, the coercivity of the FM free layer is reduced such that it is subject to magnetization by an in-plane magnetic field H. Accordingly, when the potential difference $V_c$ is removed, VCMA effects are removed and the magnetic field H, which is substantially anti-parallel to the magnetization direction of the FM fixed layer, causes the FM free layer to adopt a direction of magnetization that is antiparallel with the magnetization direction of the FM fixed layer. Hence, as the MEJ now includes an FM fixed layer and an FM free layer that have magnetization directions that are antiparallel, it reads out a second information state (resistance value) different from the first. In general, it should be understood that in many embodiments where the magnetization directions of the free layer and the fixed layer are substantially in-plane, the application of a voltage enhances the perpendicular magnetic anisotropy such that the FM free layer can be caused to adopt an out-of-plane direction of magnetization. The magnetization direction can thereby be made to switch. In general, it can be seen that by controlling the potential difference and the direction of an applied external magnetic field, an MEJ switch can be achieved.

It should of course be understood that the direction of the FM fixed layer's magnetization direction need not be in-plane—it can be in any suitable direction. For instance, it can be substantially out of plane. Additionally, the FM free layer can include both in-plane and out-of-plane magnetic anisotropy directional components. FIG. 5B depicts a corresponding case relative to FIG. 5A when the FM fixed and FM free layers have magnetization directions that are perpendicular to the layers of the MEJ (out-of-plane). It is of course important, that an FM, magnetically anisotropic, free layer be able to adopt a magnetization direction that is either substantially parallel with an FM fixed layer, or substantially antiparallel with an FM fixed layer. In other words, when unburdened by a potential difference, the FM free layer can adopt a direction of magnetization that is either substantially parallel with or antiparallel with the direction of the FM fixed layer's magnetization, to the extent that a distinct measurable difference in the resistance of the MEJ that results from the principles of magnetoresistance as between the two states (i.e. parallel alignment vs. antiparallel alignment) can be measured, such that two distinct information states can be defined.

Note of course that the application of an externally applied magnetic field is not the only way for the MEJ to take advantage of reduced coercivity upon application of a potential difference. For example, the magnetization of the FM fixed layer can be used to impose a magnetization direction on the free layer when the free layer has a reduced coercivity. Moreover, an MEJ can be configured to receive a spin-transfer torque (STT) current when application of a voltage causes a reduction in the coercivity of the FM free layer. Generally, STT current is a spin-polarized current that can be used to facilitate the change of magnetization direction on a ferromagnetic layer. It can originate, for example, from a current passed directly through the MEJ device, such as due to leakage when a voltage is applied, or it can be created by other means, such as by spin-orbit-torques (e.g., Rashba or Spin-Hall Effects) when a current is passed along a metal line placed adjacent to the FM free layer. Accordingly, the spin orbit torque current can then help cause the FM free layer to adopt a particular magnetization direction, where the direction of the spin orbit torque determines the direction of magnetization. This configuration is advantageous over conventional STT-RAM configurations since the reduced coercivity of the FM free layer reduces the amount of current required to cause the FM free layer to adopt a particular magnetization direction, thereby making the device more energy efficient.

Figure 6:
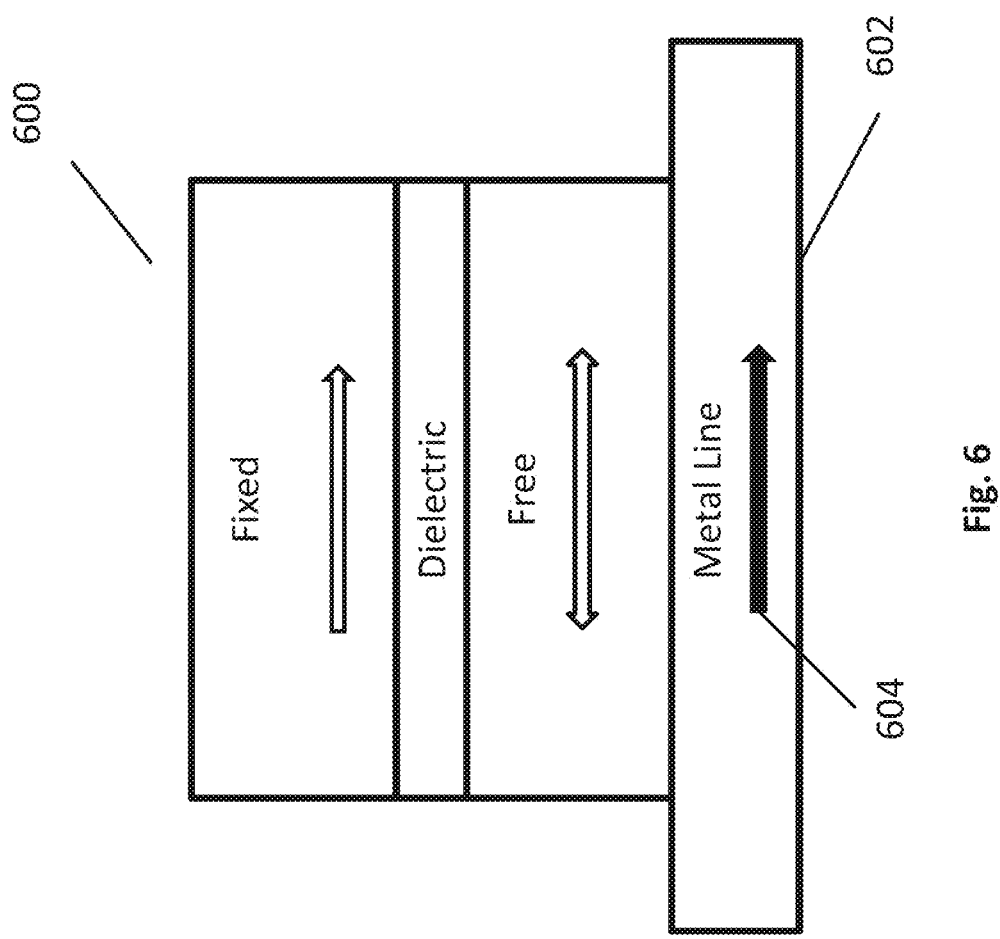
FIG. 6 illustrates an MEJ having a metal line parallel to and proximate the free layer where current can pass through the metal line and thereby induce spin-orbit torques that can cause the ferromagnetic free layer to adopt a particular magnetization direction in accordance with certain embodiments of the invention.

FIG. 6 depicts using a metal line disposed adjacent to an FM free layer to generate spin-orbit torques that can impose a magnetization direction change on the FM free layer. In particular, the MEJ 600 is similar to that seen in FIG. 1, except that it further includes a metal line 602, whereby a current 604 can flow to induce spin-orbit torques, which can thereby help impose a magnetization direction change on the ferromagnetic free layer.

Additionally, in many instances, an MEJ cell can further take advantage of thermally assisted switching (TAS) principles. Generally, in accordance with TAS principles, heating up the MEJ during a writing process reduces the magnetic field required to induce switching. Thus, for instance, where STT is employed, even less current may be required to help impose a magnetization direction change on a free layer, particularly where VCMA principles have been utilized to reduce its coercivity.

Moreover, the switching of MEJs to achieve two information states can also be achieved using voltage pulses. In particular, if voltage pulses are imposed on the MEJ for a time period that is one-half of the precession of the magnetization of the free layer, then the magnetization may invert its direction. Using this technique, ultrafast switching times, e.g. below 1 ns, can be realized; moreover, using voltage pulses as opposed to a current, makes this technique more energetically efficient as compared to the precessional switching induced by STT currents, as is often used in STT-RAM. However, this technique is subject to the application of a precise pulse that is half the length of the precessional period of the magnetization layer. For instance, it has been observed that pulse durations in the range of 0.05 to 3 nanoseconds can reverse the magnetization direction. Additionally, the voltage pulse must be of suitable amplitude to cause the desired effect, e.g. reverse the direction of magnetization.

Based on this background, it can be seen that MEJs can confer numerous advantages relative to conventional MTJs. For example, they can be controlled using voltages of a single polarity—indeed, the '739 patent, incorporated by reference above, discusses using diodes, in lieu of transistors, as access devices to the MEJ, and this configuration is enabled because MEJs can be controlled using voltage sources of a single polarity.

Additionally, MEJs can be implemented in any of a variety of configurations in accordance with embodiments of the invention. For example, the '671 patent application (incorporated by reference above) discloses MEJ configurations that include a second dielectric layer proximate the free layer and configured to enhance the VCMA effect. It should be clear that any suitable MEJ configuration can be incorporated in accordance with embodiments of the invention.

Figure 7:
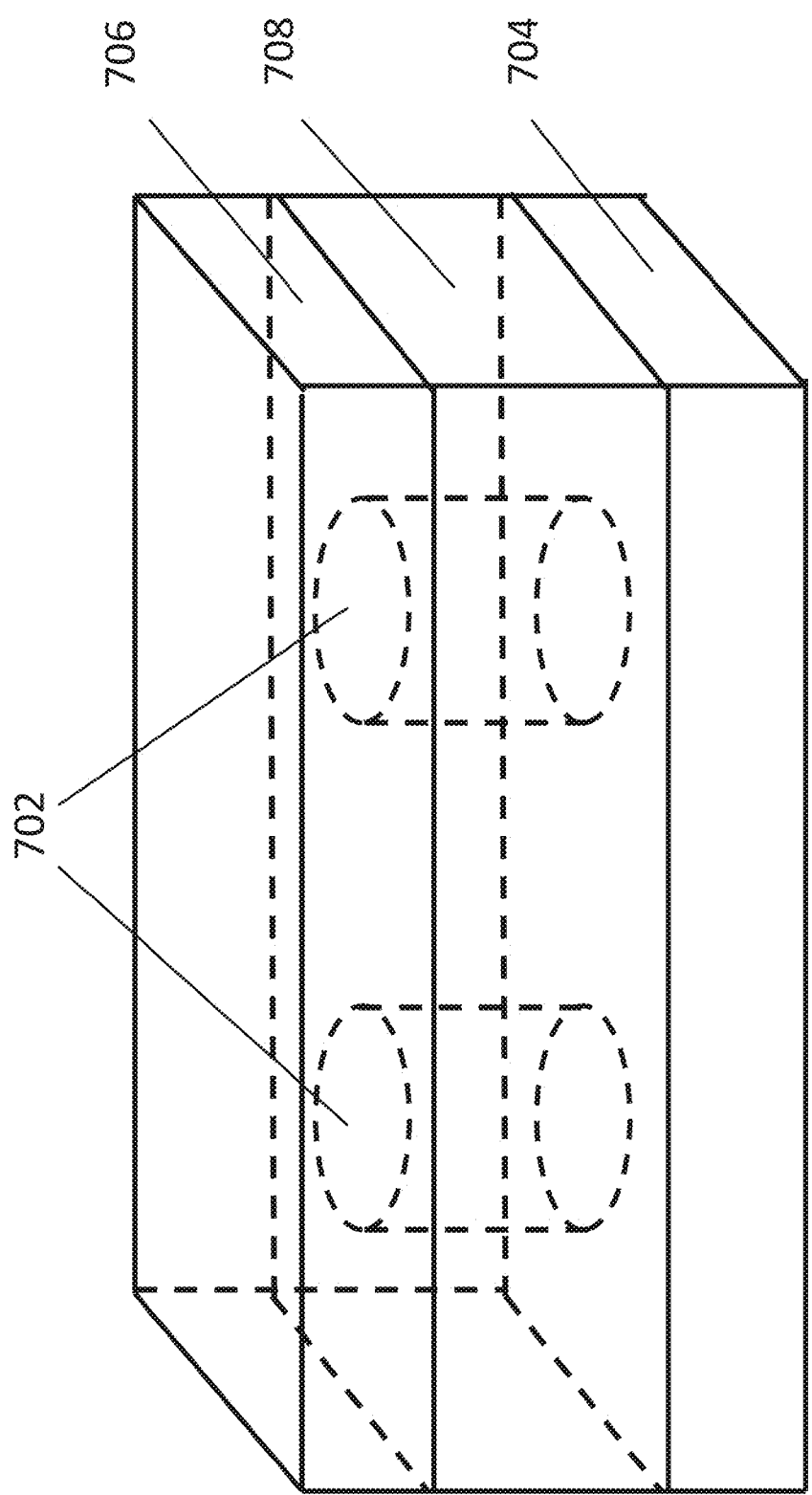
FIG. 7 illustrates the implementation of a plurality of MEJs in accordance with certain embodiments of the invention.

Note that while the above discussion largely regards the operation of single MEJs, it should of course be understood that in many instances, a plurality of MEJs are implemented together. For example, the '671 patent application discloses MeRAM configurations that include a plurality of MEJs disposed in a cross-bar architecture. It should be clear that MEJ systems can include a plurality of MEJs in accordance with embodiments of the invention. Where multiple MEJs are implemented, they can be separated by field insulation, and encapsulated by top and bottom layers. Thus, for example, FIG. 7 depicts the implementation of two MEJs that are housed within encapsulating layers and separated by field insulation. In particular, the MEJs 702 are encapsulated within a bottom layer 704 and a top layer 706. Field insulation 708 is implemented to isolate the MEJs and facilitate their respective operation. It should of course be appreciated that each of the top and bottom layers can include one or multiple layers of materials/structures. As can also be appreciated, the field insulation material can be any suitable material that functions to facilitate the operation of the MEJs in accordance with embodiments of the invention. While a certain configuration for the implementation of a plurality of MEJs has been illustrated and discussed, any suitable configuration that integrates a plurality of MEJs can be implemented in accordance with embodiments of the invention.

It has recently been reported that the straining of the constituent components of an MEJ can significantly enhance VCMA phenomena and relatedly lower switching voltages. Accordingly, in many embodiments, particularly efficacious and efficient MEJ configurations that take advantage of this relationship are implemented. The impact of strain on VCMA phenomena is now discussed below.

Strain and VCMA

It has recently been reported that the straining of the constituent components in an MEJ can enhance VCMA phenomena. For example, in "*Giant Magnetoelectric Effect in Strained Heavy Metal/Magnet/Insulator Heterostructures*," P. V. Ong et al. disclose ab initio calculations that show that epitaxial strain on the constituent components of an MEJ can have a dramatic effect on VCMA phenomena. The disclosure of "*Giant Magnetoelectric Effect in Strained Heavy Metal/Magnet/Insulator Heterostructures*" is hereby incorporated by reference in its entirety especially as it pertains to ab initio calculations regarding the relationship between strain and VCMA phenomena. In general, it is understood that the straining of MEJ constituent components impacts the shape, hybridization, and occupancy of atomic orbitals, which in turn affects the magnetic anisotropy and voltage dependence. Accordingly, in many embodiments, strain is introduced into one of: the free layer of an MEJ, the seed layer of an MEJ, the tunnel barrier of an MEJ, the interface between the free layer and the seed layer, the interface between the free layer and the tunnel barrier, and combinations thereof. For example, in many embodiments, a layer including a piezoelectric material is adjoined (either directly or indirectly) with at least one MEJ, such that the layer can be controllably strained, and thereby controllably strain portions of the at least one MEJ. In a number of embodiments, the seed layer of an MEJ is particularly engineered so as to impart a permanent strain within the MEJ that can allow it to operate more efficiently. The utilization of piezoelectric materials to impose strain within an MEJ is now discussed in greater detail below.

MEJ Configurations that Include Piezoelectric Materials

In many embodiments, MEJs are implemented in conjunction with layers including piezoelectric materials such that a potential difference can be controllably applied to the layer including the piezoelectric material thereby straining the layer; the layer including the piezoelectric material can be associated with at least one MEJ such that the straining of the layer can relatedly strain the MEJ. In this way, MEJs can be controllably strained. As can be appreciated, using piezoelectric materials in this manner can be achieved in any suitable way in accordance with embodiments of the invention.

Figure 8A:
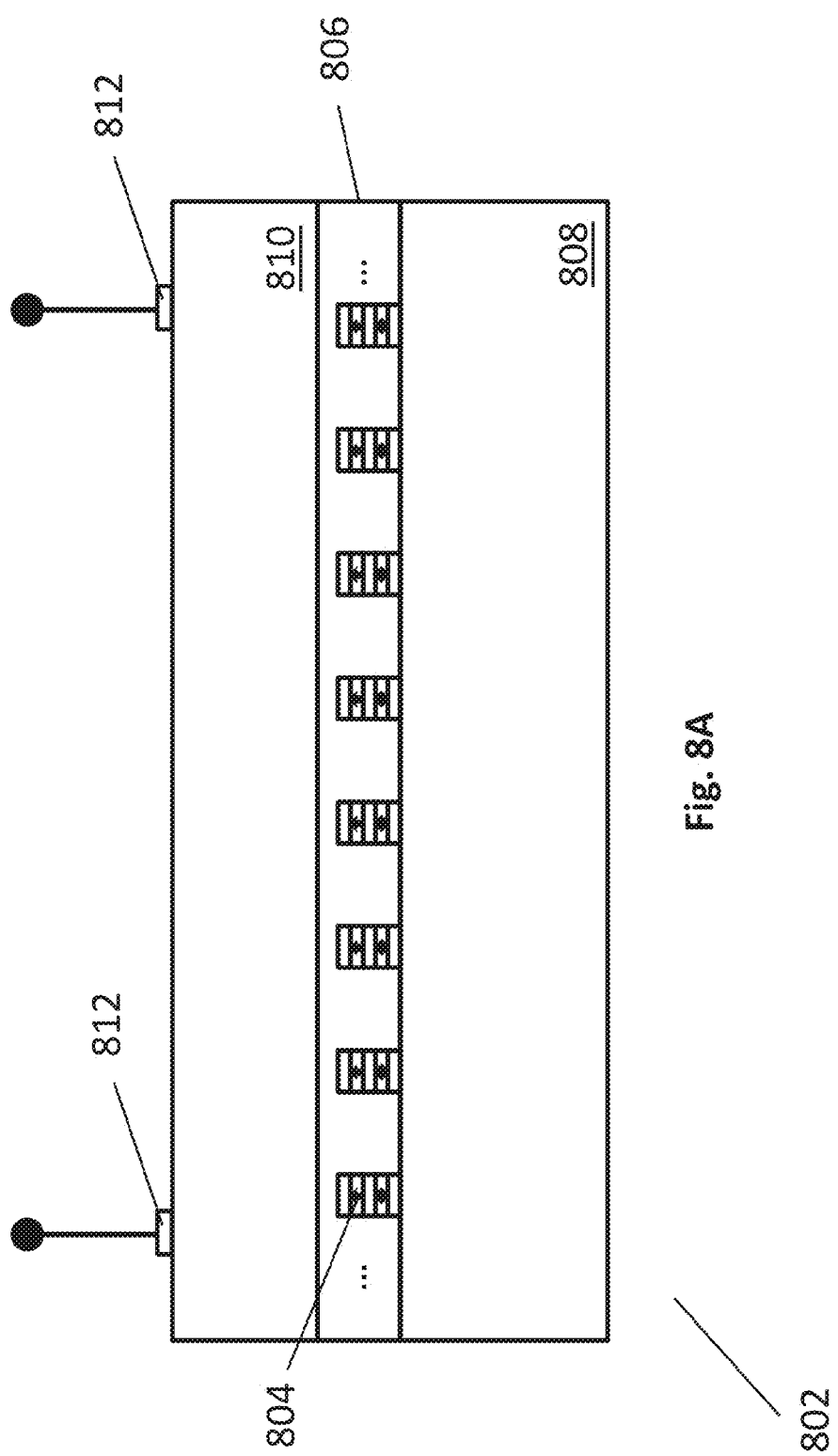
FIGS. 8A and 8B illustrate an MEJ system that includes an upper encapsulating layer that includes a piezoelectric material and has laterally disposed electrodes in accordance with certain embodiments of the invention.
Figure 8B:
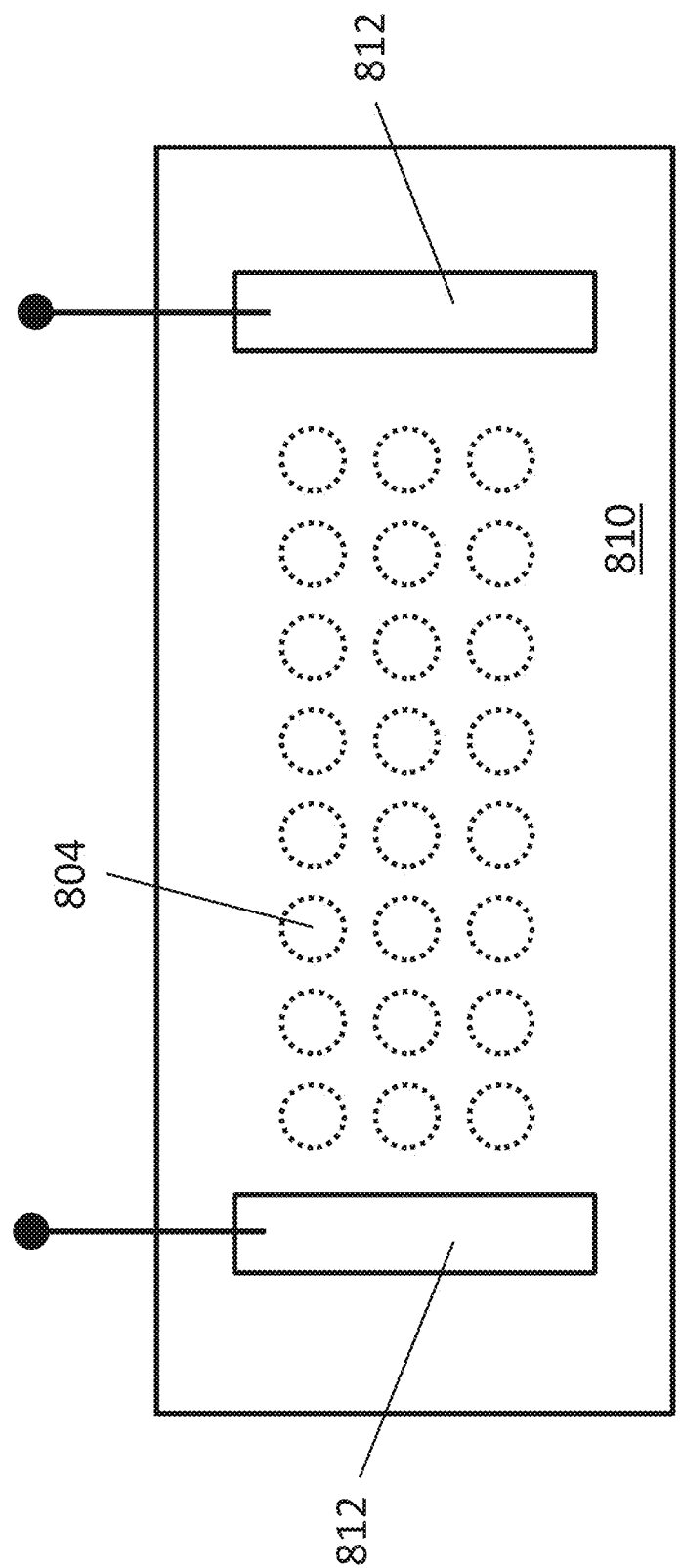

For example, FIGS. 8A and 8B illustrate an MEJ system that includes an upper encapsulating layer 810 that includes a piezoelectric material. In particular, FIGS. 8A and 8B illustrate an MEJ system 802 including a plurality of MEJs 804, separated by field insulation 806, and deposited on a bottom encapsulating layer 808. Any suitable MEJs can be implemented, including those characterized by any of the above-described MEJ configurations. As before, the field insulation 806 can be any suitable field insulation that facilitates the operation of the respective MEJs, and the bottom layer can include one or multiple materials/structures. In many embodiments, the field insulation layer and/or the bottom encapsulating layer are characterized by a relatively small Young's modulus. For instance, in many embodiments, the field insulation layer and/or the bottom encapsulating layer are characterized by a Young's modulus of less than approximately 100 GPa. In general, any of the layers within MEJ system can be characterized by a relatively small Young's modulus (e.g. less than approximately 100 GPa) in accordance with embodiments of the invention. Implementing layers having relatively small Young's moduli can be beneficial insofar as they can allow the desired straining effects to propagate through the system. For example, implementing rigid field insulation material may overly hinder the desired straining of the MEJ(s), whereas implementing soft field insulation material can allow for the desired straining to occur. In general, any of the layers within an MEJ system can be characterized by a small Young's modulus in accordance with certain embodiments of the invention.

In many embodiments, the field insulation layer includes one of: $SiO_2$, $Al_2O_3$, AlN, $Si_3N_4$, and combinations thereof. The upper encapsulating layer 810 can include a piezoelectric material. Any of a number of piezoelectric materials can be included within the upper encapsulating layer 810 including, but not limited to: ZnO, AlN, PZT, PMN-PT, $BaTiO_3$, $PbTiO_3$, $BiFeO_3$, and combinations thereof. The upper encapsulating layer can be considered to be indirectly adjoined to the MEJs insofar as it is in contact with the field insulation 806, which itself is in contact with the MEJs 804. In general, a layer including a piezoelectric material can be considered to be directly adjoined to an MEJ when it is in direct contact with the MEJ. Similarly, a layer including a piezoelectric material can be considered to be indirectly adjoined to an MEJ when it is separated from an MEJ by layer, or layers of solid or semi-solid material, such that the straining of the layer including the piezoelectric material can cause a straining of the MEJ.

The system 802 can further include electrodes 812 that are connected to the upper encapsulating layer including the piezoelectric material 810. Thus, the electrodes 812 can allow a potential difference to be applied to the piezoelectric material thereby causing it to strain. The straining of the layer including the piezoelectric material can then impart a stress—and an associated strain—on the associated MEJs 804, and thereby improve their efficiency. More specifically, the straining of the layer including the piezoelectric materials 810 can impose a stress/strain on the field insulation 806, which in turn can impose a stress/strain on the MEJs 804. In this way, the straining of the layer including piezoelectric material 810 can cause the MEJs 804 to experience a stress/strain. Notably, the extent of the straining of the piezoelectric material can be controlled by controlling the applied voltage. Hence, the extent of the straining experienced by the MEJs can be controlled, and efficiency gains can be enhanced.

In many embodiments, the placement of the electrodes is used to control the region of the piezoelectric material that experiences strain. For example, where the electrodes are placed far apart, the large region between the electrodes can experience strain with an applied voltage, and the MEJs proximate, or else associated with, that large region can be affected by the strain. For example, referring to FIGS. 8A and 8B, the electrodes 812 are placed across the width of the MEJ system 802. Accordingly, the electrodes 812 can cause the upper encapsulating layer (that includes the piezoelectric material) 810 to strain across its entire width. As a result, the strain demonstrated across the width of the upper encapsulating layer can cause a corresponding stress/strain in the eight depicted MEJs 804 that are within the width of the MEJ system 802.

By contrast, where the electrodes are placed close together, any imposed strain (e.g. by an applied voltage) can be confined to the corresponding localized region, and only the MEJs proximate, or else associated with, that smaller region can be made to be impacted by the strain. This can allow for dynamic re-configurability of the programming voltage of the bits. In other words, the placement of the electrodes can be used to define which region(s) of a piezoelectric material are strained. As can be appreciated, the described configurations can allow for the precise and tunable control of a plurality of MEJs.

Figure 9:
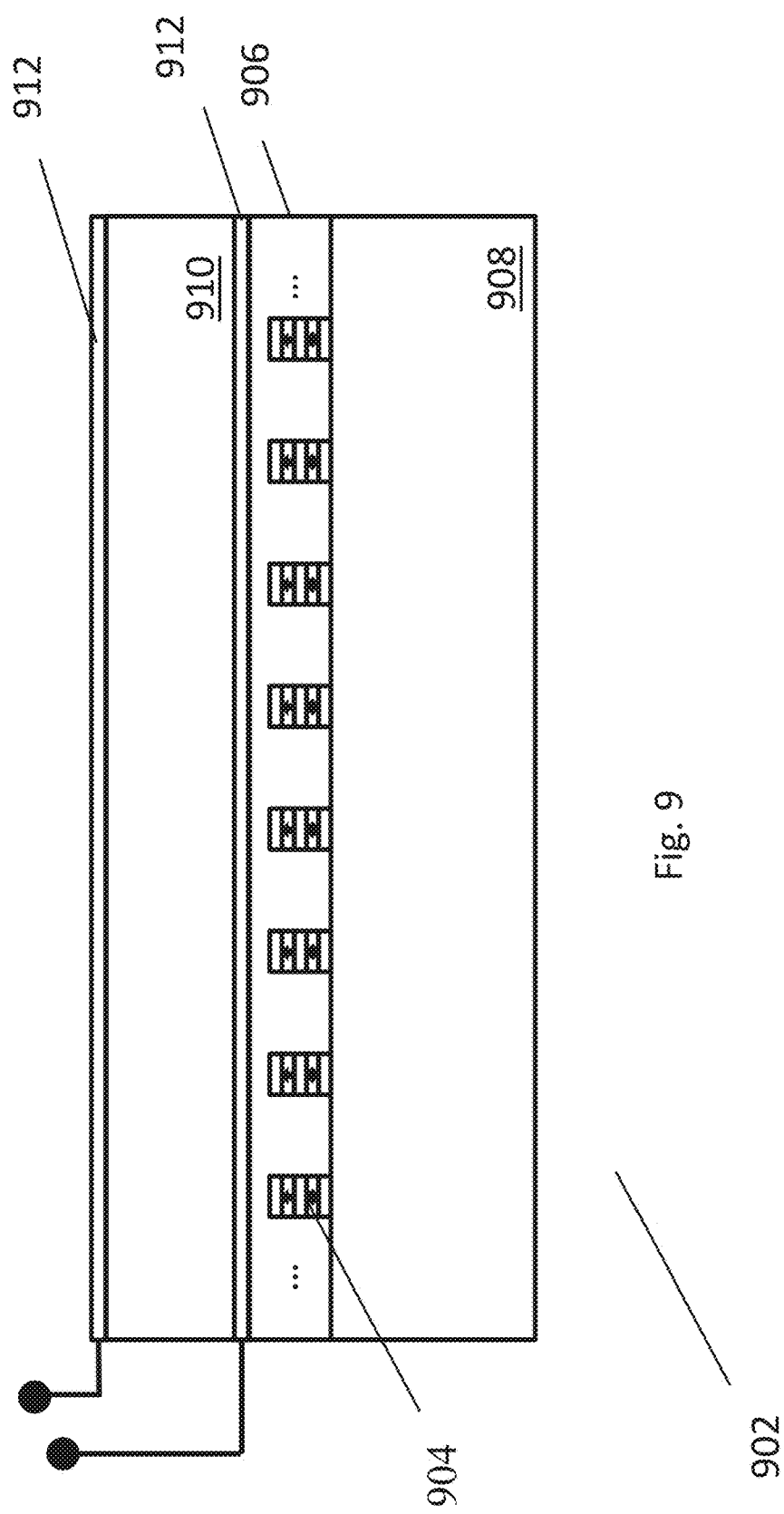
FIG. 9 illustrates an MEJ system that includes an upper encapsulating layer that includes a piezoelectric material and has vertically disposed electrodes in accordance with certain embodiments of the invention.

While FIGS. 8A and 8B and the accompanying description have regarded an MEJ system that includes two laterally disposed electrodes, it should be clear that the electrodes can be coupled to a layer including a piezoelectric material in any of a variety of ways in accordance with embodiments of the invention. For example FIG. 9 illustrates an MEJ system whereby two electrodes are coupled to the layer including a piezoelectric material in a vertical arrangement. In particular, FIG. 9 illustrates an MEJ system 902, including a plurality of MEJs 904 separated by a field insulation layer 906, and disposed on a bottom encapsulating layer 908. The upper encapsulating layer 910 includes a piezoelectric material. The two electrodes 912 sandwich the upper encapsulating layer 910. In general, piezoelectric materials can be utilized to strain MEJ(s) in any of a variety of ways in accordance with embodiments of the invention.

Figure 10B:
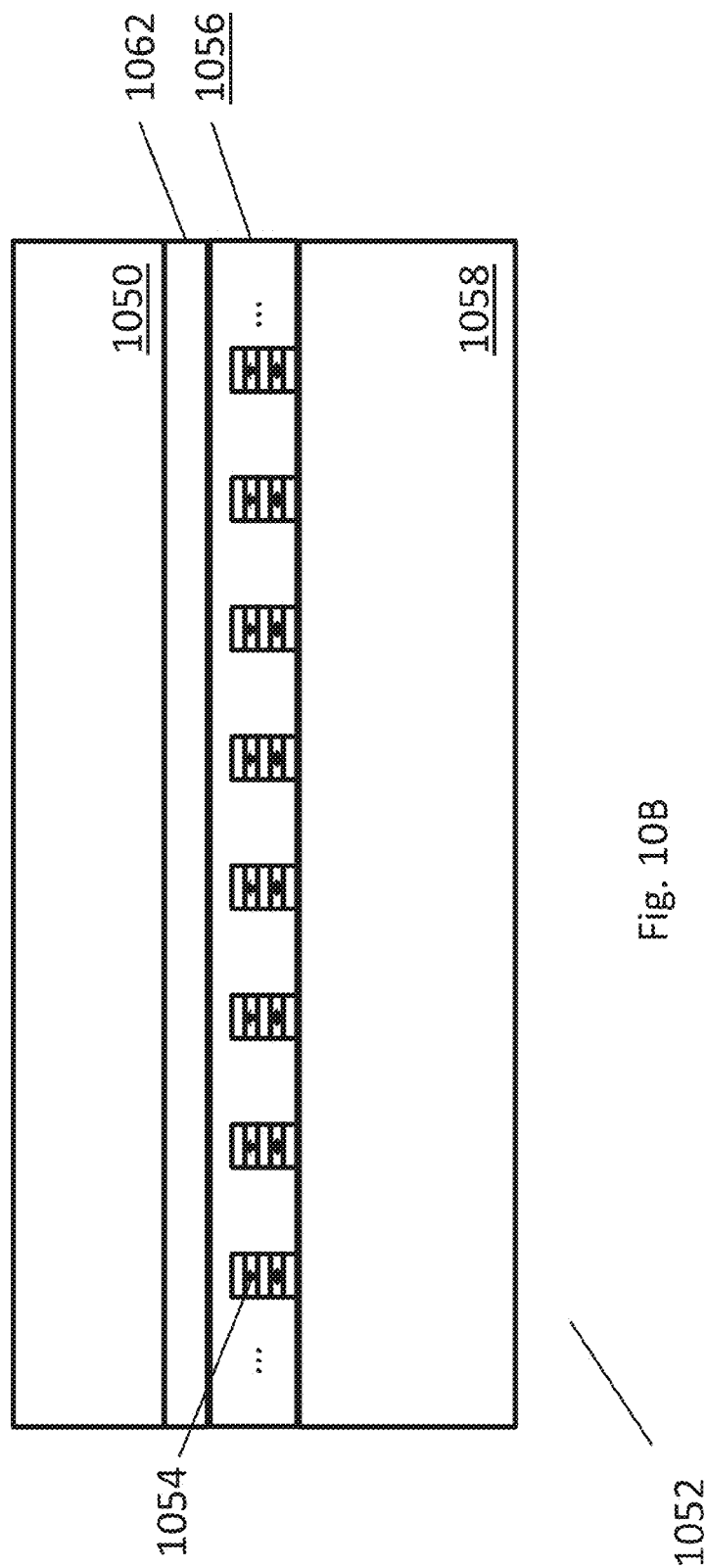

For example, while the above discussion has largely regarded piezoelectric materials incorporated within upper encapsulating layers, piezoelectric materials can be incorporated in any of a variety of layers in accordance with many embodiments of the invention. In many embodiments, a layer that includes a piezoelectric material is separate from an upper encapsulating layer in an MEJ system. For example, FIGS. 10A and 10B depict an MEJ system that includes a layer that includes a piezoelectric material that is separate from the upper encapsulating layer. In particular, FIG. 10A depicts an MEJ system 1002 that includes a plurality of MEJs 1004 separated by a field insulation layer 1006, disposed on a bottom encapsulating layer 1008, covered by an upper encapsulating layer 1010, where a layer including a piezoelectric material 1012 is disposed on the upper encapsulating layer. As before, it can be preferable if the Young's moduli of the top layer, the bottom layer, and the field insulating layer are relatively small so that the desired straining can propagate through the system. Additionally, while FIG. 10A depicts that the layer including the piezoelectric material is disposed on top of the upper encapsulating layer, in many embodiments, the layer including the piezoelectric material is disposed beneath the upper encapsulating layer. Thus, FIG. 10B depicts an MEJ system where the layer including the piezoelectric material is disposed under the upper encapsulating layer. In particular, FIG. 10B illustrates an MEJ system 1052 including a plurality of MEJs 1054 separated by field insulation 1056. A layer including a piezoelectric material 1062 is disposed on the field insulation 1056, and under the upper encapsulating layer 1050. In general, as can be appreciated, layers including piezoelectric materials can be incorporated in any of a variety of ways and arrangements in accordance with embodiments of the invention. For example, in many embodiments, piezoelectric materials are incorporated proximate or within the bottom encapsulating layer.

In a number of embodiments, multiple layers including piezoelectric materials are implemented within an MEJ system. Thus, for example, FIG. 11 illustrates an MEJ system that utilizes multiple layers of piezoelectric materials in accordance with certain embodiments of the invention. In particular, the MEJ system 1102 includes a plurality of MEJs 1104 separated by field insulation 1106. The plurality of MEJs 1104 is disposed within a bottom encapsulating layer 1108 and an upper encapsulating layer 1110. Notably, the field insulation and the plurality of MEJs 1104 is sandwiched between two layers, 1112 and 1114 that each include piezoelectric materials. Each of the two layers can share the same pair of electrodes, or they can each be associated with their own respective pair of electrodes. In this way, the strain that can be imposed by each of the two layers can be additive.

Figure 12A:
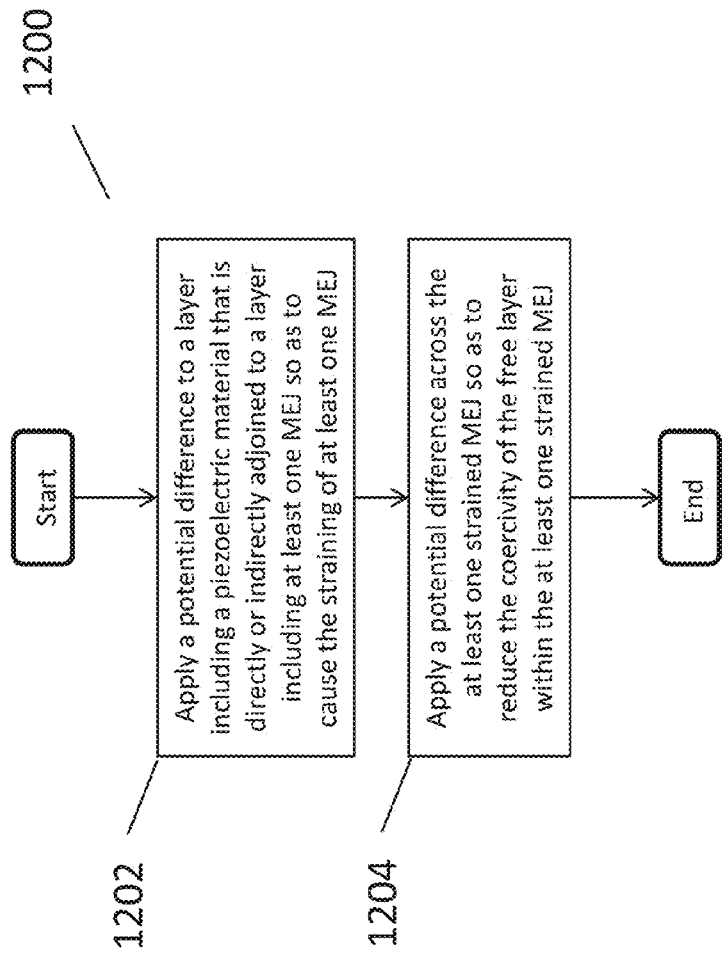
FIGS. 12A and 12B illustrate methods of efficiently operating an MEJ utilizing layers including piezoelectric materials in accordance with certain embodiments of the invention.

As can be appreciated, related to and/or embodied within the above description, are methods for efficiently operating at least one MEJ. For example, in one embodiment a method for efficiently operating at least one MEJ includes: (1) applying a potential difference to a layer including a piezoelectric material that is directly or indirectly adjoined to a layer including at least one MEJ so as to cause the straining of at least one MEJ, and (2) applying a potential difference across the at least one strained MEJ so as to reduce the coercivity of the free layer within the at least one strained MEJ. FIG. 12A illustrates the above described embodiment. In particular, FIG. 12A illustrates that a method of efficiently operating an MEJ 1200 includes applying 1202 a potential difference to a layer including a piezoelectric material that is directly or indirectly adjoined to a layer including at least one MEJ so as to cause the straining of at least one MEJ, and 1204 applying a potential difference across the at least one strained MEJ so as to reduce the coercivity of the free layer within the at least one strained MEJ.

Figure 12B:
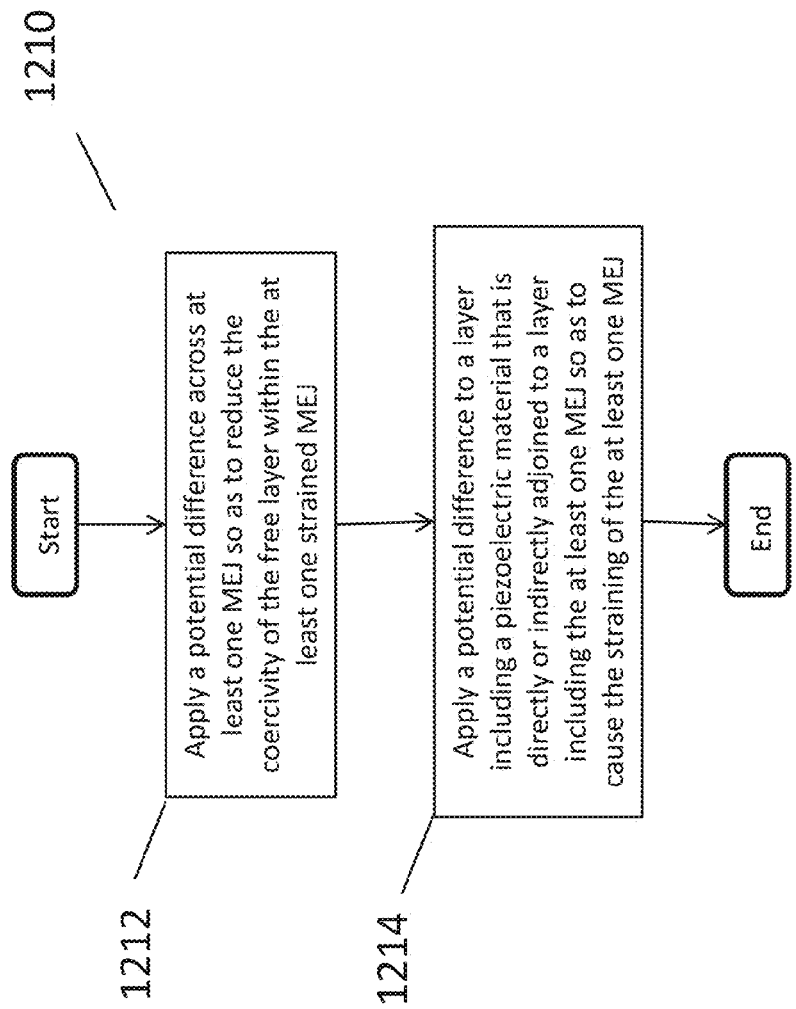

While the application of a potential difference to a strained MEJ has been discussed and illustrated, in many embodiments, a potential difference is first applied to an MEJ, and the MEJ is then strained via the application of a potential difference to a directly or indirectly adjoined piezoelectric layer. Thus, FIG. 12B illustrates a method of efficiently operating an MEJ by causing the straining of an MEJ being subjected to a potential difference. In particular, the method 1210 includes applying 1212 a potential difference across at least one MEJ so as to reduce the coercivity of the free layer within the at least one strained MEJ, and applying 1214 a potential difference to a layer including a piezoelectric material that is directly or indirectly adjoined to a layer including the at least one MEJ so as to cause the straining of the at least one MEJ that is experiencing a reduced coercivity within its free layer. In general, it should be clear that the application of a potential difference to the layer including a piezoelectric material and the application of a potential difference to an MEJ can be implemented in any suitable sequence in accordance with embodiments of the invention. In many embodiments, the potential differences applied concurrently/simultaneously.

Of course, as can be appreciated, methods for efficiently operating at least one MEJ can be implemented using any of the above-described systems in accordance with embodiments of the invention. For example, in many embodiments, methods for efficiently operating at least one MEJ include: (1) applying a potential difference to a plurality of layers including piezoelectric materials that are each directly or indirectly adjoined to a layer including at least one MEJ so as to cause the straining of at least one MEJ; and (2) applying a potential difference across the at least one strained MEJ so as to reduce the coercivity of the free layer within the at least one strained MEJ. As can be appreciated from the above discussion, in this example, the application of the potential differences can also occur in any suitable sequence. In general, as can be appreciated, methods for efficiently operating at least one MEJ can be implemented using any of the above described systems.

It should also be noted that, as can be appreciated, the above-described structures can be fabricated using any of a variety of standard deposition techniques in accordance with embodiments of the invention. For example, in many instances, sputtering techniques are used to deposit the constituent layers. For instance, the MEJ manufacturing techniques described in the '739 patent, incorporated by reference above, can be used. The '739 patent is reincorporated by reference herein, especially as it pertains to the fabrication of MEJs.

Thus, an MEJ can be prepared by depositing continuous multiple layers of films of different material (e.g. CoFeB, MgO, PtMn, IrMn, synthetic anti-ferromagnetic material). For example, the films for the fixed ferromagnetic layers and free ferromagnetic layers are deposited by a physical vapor deposition (PVD) system and subsequently annealed in an in-plane or out-of-plane magnetic field, or without a magnetic field, above 200° C. Annealing may take place under vacuum conditions to avoid oxidation of the material stack. As further example, metallic films are deposited by DC frequency sputtering while the dielectric layer is deposited by radio-frequency sputtering from a ceramic MgO target, or by DC sputtering of Mg and subsequent oxidation, or by a combination of both. Along similar lines, the piezoelectric materials can be deposited by sputtering, pulsed laser deposition, or atomic layer deposition, etc. The film deposition can be performed by deposition uniformly on a surface that is held at approximately ambient or elevated temperatures. The surfaces of these various layers may be planarized after each layer is formed to achieve better smoothness, and the planarization techniques include chemical-mechanical polishing. The deposited stacks may also be heat treated to improve the surface smoothness. The thickness of each layer can be in the range of 0.1 to 10 nm, and is designed to achieve certain spin polarization or magnetization, resistivity, voltage ranges to flip the spin, and various other electrical performance parameters. For example, the dielectric tunnel layer is designed to be thick enough to make the current-induced spin-transfer torque small. The switching speeds in MEJs are adjusted based on their design and composition. As to the shape of the MEJ devices, depending on the material, the in-plane configuration tends to perform better if the flat end surface were elliptical, oblong, rectangular, etc., so that the geometry is elongated in one direction (length is greater than width). In some instances, the MEJs can be made to have a circular geometry.

These techniques for MEJ fabrication can be integrated with any of a variety of known techniques for depositing layers including piezoelectric materials, as well as any of the other layers described in the above-described MEJ systems. It should be clear though that any suitable techniques for fabricating the above-described MEJ systems can be implemented.

In general, it is seen that layers including piezoelectric materials can be incorporated in any of a variety of ways in accordance with embodiments of the invention. It should be clear that the above examples are meant to be illustrative and not exhaustive. For example, while the above examples include MEJs enclosed within upper and lower encapsulating layers, in many embodiments MEJ systems do not necessarily include discrete encapsulating layers. Furthermore, while the above examples have largely regarded single layers that include piezoelectric materials disposed proximate or within upper encapsulating layers, in many embodiments, layers that include piezoelectric materials are disposed within or proximate a bottom encapsulating layer. In general, any suitable configuration for an MEJ system that harnesses the ability of a piezoelectric material to be controllably strained can be implemented in accordance with embodiments of the invention.

More generally, while certain features of the systems and methods have been illustrated and described herein, modifications, substitutions, changes and equivalents will occur to those skilled in the art. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described. For example, the MEJs discussed may be modified, but still consistent with the principles described herein. It is to be understood that the magnetoelectric elements and piezoelectric materials can be utilized in different embodiments and applications that may require tweaking to fit a particular situation and set of electronics, and that these variations are within embodiments of the invention.

What is claimed is:

1. A magnetoelectric junction system comprising:
   at least one magnetoelectric junction, itself comprising:
      a ferromagnetic fixed layer;
      a ferromagnetic free layer that is magnetically anisotropic; and
      a dielectric layer interposed between the ferromagnetic fixed layer and the ferromagnetic free layer;
   and
   a first layer comprising a piezoelectric material configured to produce a controlled strain in the first layer upon application of a potential difference thereto;
   wherein the ferromagnetic fixed layer is magnetized in a first direction;

wherein the ferromagnetic free layer can adopt a magnetization direction that is either substantially parallel with or substantially antiparallel with the first direction;

wherein the at least one magnetoelectric junction is configured such that when a first electric field is applied across only the aggregate of the ferromagnetic fixed layer, the dielectric layer, and the ferromagnetic free layer, the coercivity and anisotropy of the ferromagnetic free layer is affected for the duration of the application of the electric field such that an applied magnetic field imposes a magnetization direction on the ferromagnetic free layer;

wherein the first layer is disposed such that the controlled strain of the first layer induces a related strain in the at least one magnetoelectric junction;

wherein the strain induced on the at least one magnetoelectric junction enhances a voltage-controlled magnetic anisotropy phenomena, affecting the anisotropy of the free layer within the magnetoelectric junction such that the magnitude of the electric field required to allow for the imposition of a magnetization direction on the ferromagnetic free layer is reduced; and wherein the related strain in the at least one magnetoelectric junction affects the rate of change of anisotropy and coercivity of the free layer in response to the first electric field.

2. The magnetoelectric junction system of claim 1 further comprising a field insulation layer within which the at least one magnetoelectric junction is enveloped.

3. The magnetoelectric junction system of claim 2, wherein the field insulation layer comprises one of: $SiO_2$, $Al_2O_3$, AlN, $Si_3N_4$, and combinations thereof.

4. The magnetoelectric junction system of claim 2, further comprising at least one encapsulating layer that bounds the field insulation layer.

5. The magnetoelectric junction system of claim 4, wherein at least one encapsulating layer comprises one of: ZnO, AlN, PZT, PMN-PT, $BaTiO_3$, $BiFeO_3$, and combinations thereof.

6. The magnetoelectric junction system of claim 4, wherein the first layer comprising a piezoelectric material is an encapsulating layer.

7. The magnetoelectric junction system of claim 4, wherein the first layer comprising a piezoelectric material is separate from an encapsulating layer.

8. The magnetoelectric junction system of claim 4, wherein at least one of the field insulation, the first layer comprising a piezoelectric, and the encapsulating layer is characterized by a Young's modulus of less than 100 GPa.

9. The magnetoelectric junction system of claim 2, wherein at least two electrodes that can cause the application of a potential difference are coupled to the first layer comprising a piezoelectric material such that the application of a potential difference to the first layer can cause a lateral straining of the first layer.

10. The magnetoelectric junction system of claim 9, wherein the first layer comprising a piezoelectric material defines an upper surface and a lower surface, and a first electrode is coupled to the upper surface, and a second electrode is coupled to the lower surface.

11. The magnetoelectric junction system of claim 2 further comprising a second layer comprising a piezoelectric material disposed proximate at least one magnetoelectric junction, wherein the straining of at least some portion of the second layer comprising a piezoelectric material causes at least some portion of at least one magnetoelectric junction to experience a stress and a related strain.

12. The magnetoelectric junction system of claim 2, wherein the magnetoelectric junction defines a seed layer that is proximate the free layer, and wherein the straining of at least some portion of the first layer comprising a piezoelectric material causes at least some portion of the seed layer, the free layer, and/or the dielectric layer to relatedly to experience a stress and a related strain.

13. The magnetoelectric junction system of claim 2, further comprising an externally applied magnetic field that is characterized by a magnetic direction that is substantially parallel with or substantially antiparallel with the first direction, wherein the externally applied magnetic field has a sufficient strength to cause the ferromagnetic free layer to adopt the magnetic direction of the externally applied magnetic field when the coercivity of the ferromagnetic free layer has been reduced by the application of a potential difference across the associated magnetoelectric junction and the magnetoelectric junction is being strained.

14. The magnetoelectric junction system of claim 2, further comprising a metal line disposed adjacent to at least one magnetoelectric junction, wherein the adjacent metal line can induce spin-orbit torques or Osterd field that can cause the ferromagnetic free layer to adopt a particular magnetization direction.

15. The magnetoelectric junction system of claim 1, wherein the at least one magnetoelectric junction is configured such that when a potential difference is applied across the magnetoelectric junction, the strength of the magnetic anisotropy in a direction perpendicular to the plane of the free layer is modified, and the magnetization direction of the free layer is relatedly modified, for the duration of the application of the potential difference.

* * * * *